(12) United States Patent
Linhares, Jr. et al.

(10) Patent No.: US 8,355,246 B2
(45) Date of Patent: Jan. 15, 2013

(54) MODULAR AIR MANAGEMENT DEVICES

(76) Inventors: Manuel D. Linhares, Jr., Coventry, RI (US); Michael J. Tresh, Haverhill, MA (US); David Lucia, Stafford Springs, CT (US); Dan Murphy, San Francisco, CA (US); Meagan Foley, Belchertown, MA (US); Mark Dignum, Loudonville, NY (US); Richard Latino, Sterling, MA (US)

( * ) Notice: Subject to any disclaimer, the term of this patent is extended or adjusted under 35 U.S.C. 154(b) by 295 days.

(21) Appl. No.: 12/562,772

(22) Filed: Sep. 18, 2009

(65) Prior Publication Data

US 2010/0238626 A1 Sep. 23, 2010

Related U.S. Application Data

(60) Provisional application No. 61/102,912, filed on Oct. 6, 2008, provisional application No. 61/098,067, filed on Sep. 18, 2008.

(51) Int. Cl.
*H05K 7/20* (2006.01)

(52) U.S. Cl. ........... 361/679.46; 361/679.5; 361/679.51; 361/694; 454/184; 454/254; 312/223.1

(58) Field of Classification Search ............. 361/679.46, 361/679.49–679.51, 690, 694, 724
See application file for complete search history.

(56) References Cited

U.S. PATENT DOCUMENTS

| 7,764,495 | B2 * | 7/2010 | Hruby et al. | 361/692 |
|---|---|---|---|---|
| 7,907,402 | B2 * | 3/2011 | Caveney | 361/694 |
| 7,990,726 | B2 * | 8/2011 | Izuhara et al. | 361/732 |
| 2008/0316703 | A1 * | 12/2008 | Donowho et al. | 361/695 |
| 2009/0239461 | A1 * | 9/2009 | Lewis, Ii et al. | 454/184 |
| 2010/0315788 | A1 * | 12/2010 | Vanderveen et al. | 361/724 |

* cited by examiner

*Primary Examiner* — Courtney Smith
(74) *Attorney, Agent, or Firm* — Mirick, O'Connell, DeMallie + Lougee, LLP

(57) ABSTRACT

The invention provides modular air management devices for directing or diverting air flow within an equipment cabinet or enclosure to provide adequate cooling for non-"front to back" breathing electronic devices, and include a scoop assembly, a tray assembly, a vertical mount assembly, and a shroud assembly. The air management devices are designed to direct air flow to and from "side to side" breathing and "side inlet, rear exhaust" electronic equipment. The assemblies may be mounted inside or outside enclosure rails and may be augmented with fan assemblies.

5 Claims, 35 Drawing Sheets

MODULAR AIR MANAGEMENT DEVICES

CROSS-REFERENCE TO RELATED APPLICATIONS

This application claims priority to U.S. Provisional Patent Application Ser. No. 61/102,912, entitled "Directional Air Scoop," filed on Oct. 6, 2008, and to U.S. Provisional Patent Application Ser. No. 61/098,067, entitled "Directional Air Manager," filed on Sep. 18, 2008. The entire contents of both priority applications are expressly incorporated by reference herein.

FIELD OF THE INVENTION

The invention relates to cabinets and enclosures for rack-mounted electrical and computer equipment, and particularly to assemblies for improving the air flow distribution within such cabinets and enclosures.

BACKGROUND OF THE INVENTION

Electronic equipment, such as computer servers and data storage devices, is often mounted on a rack or frame using mounting members such as shelves, rails and/or brackets. Doors and panels are often added to the frames and racks, creating cabinets and enclosures, to protect the electronic equipment from the external environment and/or to provide security. As is well known, these electronic devices generate substantial heat that must be dissipated in order to maintain the devices in proper working order and prevent damage and possible failure. The addition of the doors and panels, however, exacerbates the problem of heat removal within the cabinets and enclosures.

Most electronic devices manufacturers require air of a specific temperature range to be drawn into the front of the device, passed over the internal components where the heat is exchanged, and exhausted out of the back of the device. Cabinets and enclosures, as well as the data centers or rooms that house the cabinets, are typically set up to accommodate this "front to back" air flow requirement.

Some electronic equipment, however, is designed to draw cool air in from vents or ports on one side of the device instead of the front, and then exhaust it out the other side of the device. These devices are sometimes called "side to side" breathers. Alternatively, some electronic equipment use "side to rear" cooling, where the device is designed to draw cool air in from vents on one or both sides of the device instead of the front, and then exhaust it out the rear of the device.

In practice, devices that take in cool air from one or more sides may be installed "backwards" to face the rear of the enclosure, such that they exhaust heated air to the front of the enclosure. As a result, when used in cabinets that are optimized for "front to back" cooling, these devices actually take in heated air from the back of the cabinet, due to the placement of their intake vents, and exhaust even warmer air to the front or sides of the cabinet, depending upon the particular design of the device. This configuration is not a problem if the air temperature within the enclosure remains within acceptable operating limits. However, as more powerful equipment is installed in cabinets, and as the cabinets become more densely packed with electronic equipment, the inlet temperature of the air drawn into the devices is more likely to exceed the recommended operating range of the device. The result is an upward trend in the failure of these electronic devices. Such equipment failures are more than an inconvenience, as some failures may result in interruptions to mission critical systems and communications, such as those used for example in emergency response management, aviation and flight control, process control, and finance.

In addition to the disruption to the systems and communications described above, these electronic devices themselves are expensive. While it may be possible to redesign these devices to conform to the standard "front to back" air flow configuration, this is usually an expensive and impractical undertaking, and typically not under the control of data center managers or those who install and maintain the cabinets and enclosures. Nor is it feasible to reconfigure cabinets and data centers, as the "front to back" air flow configuration is well-established, and ideal for routing and accessing cables. There is a need in the art, then, for assemblies that enable these non-"front to back" devices to intake conditioned air typically found at the front of a cabinet or enclosure and exhaust the heated air to the rear of the cabinet, regardless of the device's orientation in the enclosure or its breathing methodology.

SUMMARY OF THE INVENTION

The invention provides modular air management devices for directing or diverting air flow within an equipment cabinet or enclosure to address the issues of inadequate cooling of electronic devices that do not implement traditional "front to back" breathing methodologies.

In a preferred embodiment, the invention comprises a modular air management scoop assembly for use with "side to side" breathing electronic devices in a "front-to-back" air-distributed enclosure, where the electronic device is mounted on rails within the enclosure.

In an additional preferred embodiment, the invention comprises a modular air management tray assembly, for use with non-"front to back" breathing electronic devices in a "front-to-back" air-distributed enclosure, where the electronic device is mounted on rails within the enclosure.

In an additional preferred embodiment, the invention comprises a modular vertical mount air management assembly, for use with non-"front to back" breathing electronic devices in a "front-to-back" air-distributed enclosure, where the electronic device is mounted outside the rails of the enclosure.

In an additional preferred embodiment, the invention comprises a modular air management shroud assembly, for use with non-"front to back" breathing electronic devices in a "front-to-back" air-distributed enclosure, to direct cooled air to both the top and side of the electronic device.

Embodiments of the invention may provide a number of advantages, including:

Airflow Management—allows non-"front to back" breathing devices to adapt to "front to back"-cooled enclosures.

Passive Airflow Management—does not require additional active components to manage airflow.

Active Airflow Management—can be adapted to add active cooling equipment on either the intake side or the exhaust side of the electronic device.

Reversible Application—can be installed either front-to-back or back-to-front.

Adjustable Application—can be installed within multiple mounting settings and rail positions.

Modular Application—can be installed with or without various features and settings as well as in multiple arrangements and configurations.

Hot Swappability—Non-"front to back" cooled equipment can be hot-swapped without fully removing the modular air management device.

Space/Size Adaptability—can be adapted for use with electronic equipment in a range of sizes and heights.

Material Selection—can be constructed in multiple materials to meet different cost and environment requirements.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS OF THE INVENTION

Modular Air Management Scoop Assembly

Figure 1A:
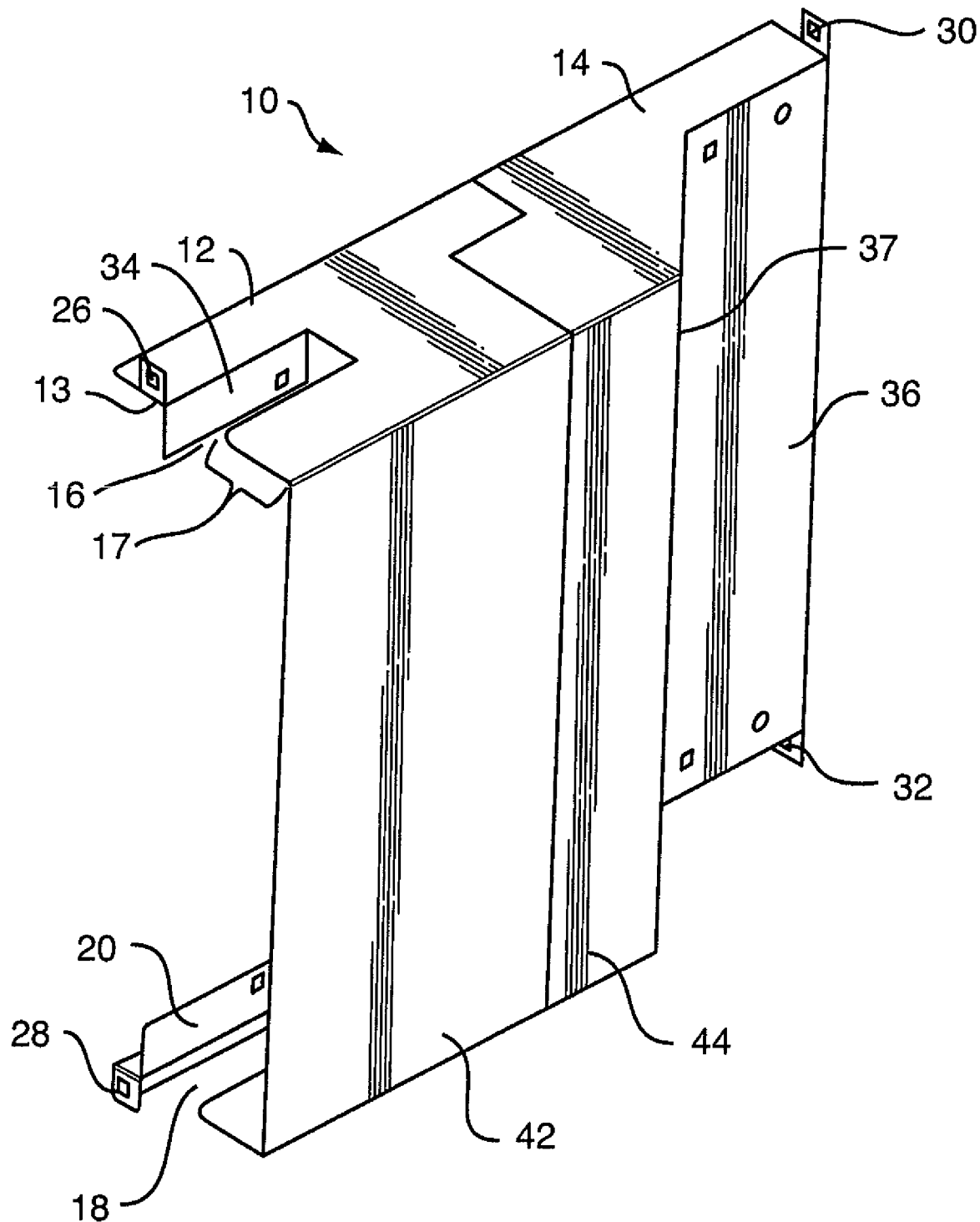
FIG. 1A is a perspective view of a modular air management scoop assembly, according to a preferred embodiment of the invention.

In a preferred embodiment, and as shown in FIG. 1A, the invention comprises a modular air management scoop assembly 10 for use with a "side to side" breathing electronic device in a "front-to-back" air-distributed enclosure. Air management scoop assembly 10 is designed to be coupled to the rails of an enclosure or cabinet. Air management scoop assembly 10 directs cold air from the front of the enclosure into one side of a "side to side" breathing electronic device, and directs the heated air from the opposite side of the "side to side" breathing electronic device to the back of the enclosure. Air management scoop assembly 10 is adjustable in size and reversible, such that one mechanical structure can be used to both direct air into the electronic device and direct air out of and away from the electronic device. Air management scoop assembly 10 also supports the electronic device within the enclosure, and allows the electronic device to be hot-swapped out of the enclosure.

Figure 1B:
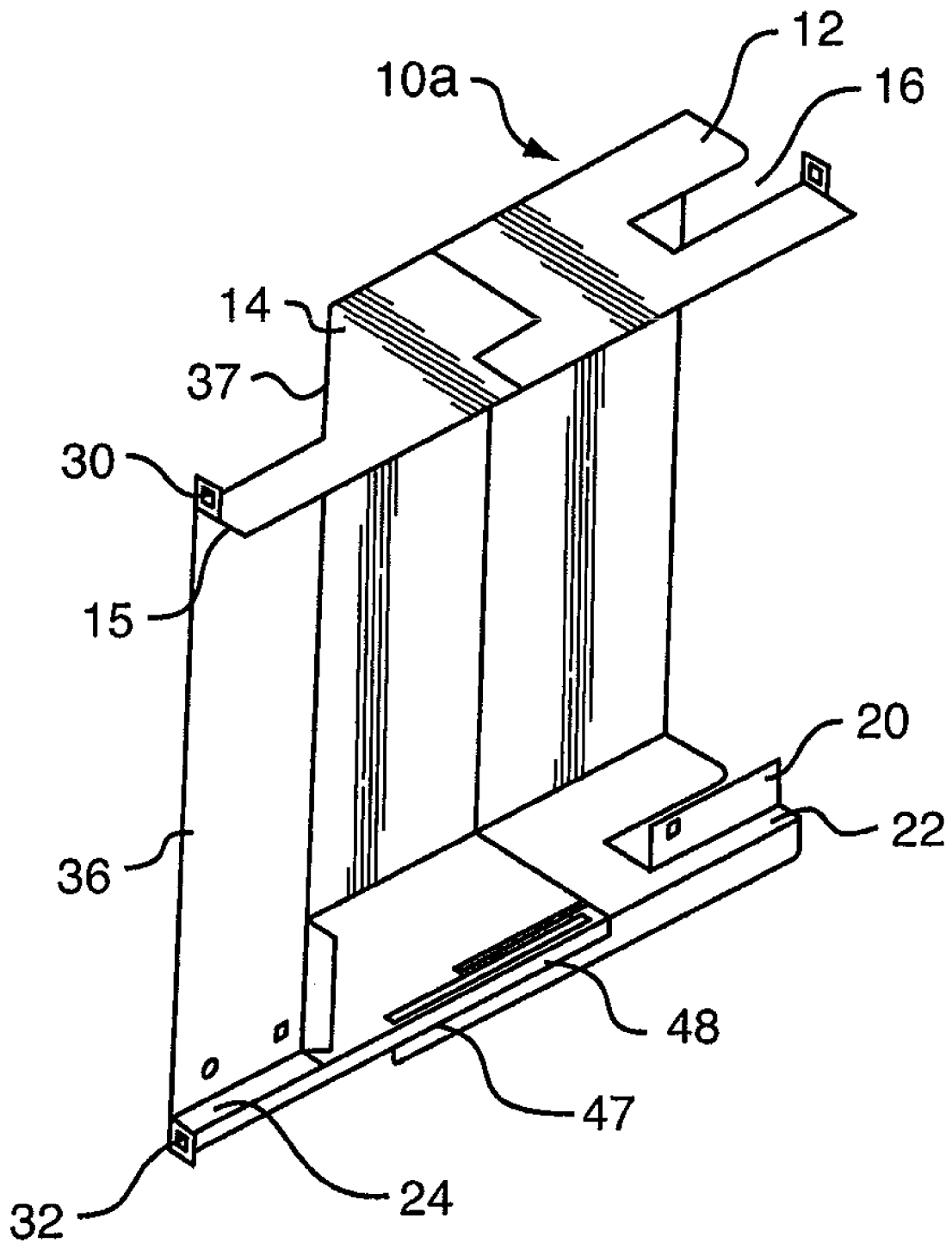
FIG. 1B is a perspective view of the reverse side of the modular air management scoop assembly of FIG. 1A.
Figure 5:
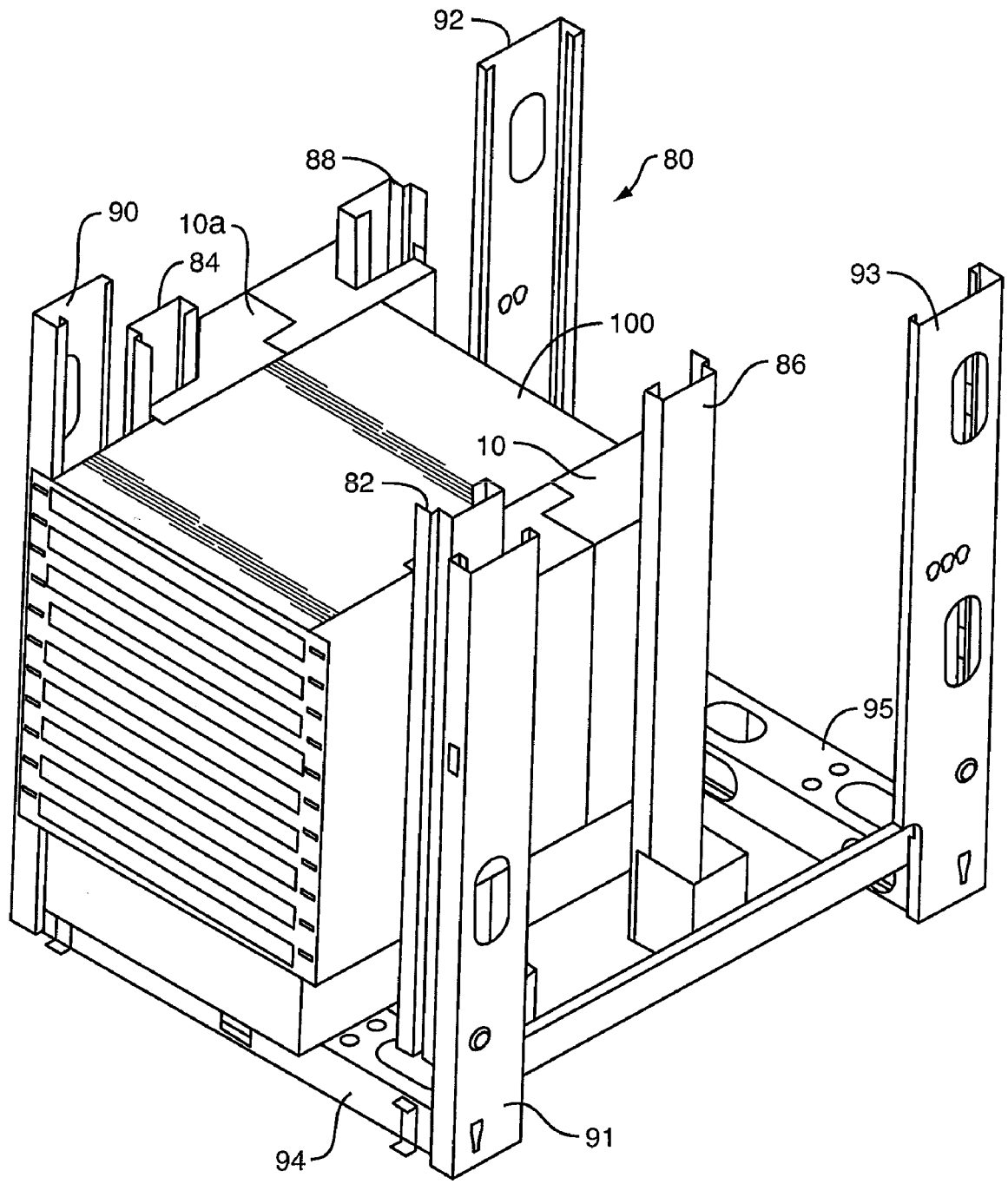
FIG. 5 illustrates the manner in which an electronic device may be slid into and out of the enclosure of FIG. 3.

With further reference to FIGS. 1A and 1B, air management scoop assembly 10 comprises first scoop portion 12 with enlarged end 13 and second scoop portion 14 with narrow end 15. First and second scoop portions 12 and 14 are in sliding interlocked engagement with one another; sliding interlock structure 48 is described below. Air management scoop assembly 10 further comprises slots 16 and 18, which are formed such that first scoop portion 12 can fit around a vertical mounting rail within the enclosure, as shown in FIG. 5 and described below. Upper tabs 26 and 30 and lower tabs 28 and 32 provide structures that allow air management scoop assembly 10 to be mounted to the mounting rails within the enclosure, as shown in FIG. 5 and described below.

As shown in FIGS. 1A and 1B, first scoop portion 12 defines rear wall 42 that fits over and is able to slide back and forth over rear wall 44 of second scoop portion 14. Rear wall 36 of second scoop portion 14 and angled wall 37 partially define narrow end 15. Flanges 20 and 34 define stop positions for the electronic device (not shown), which sits on shelf portion 47 that lies along the edge of the scoop portions 12 and 14 and includes portion 22 adjacent to flange 20 and enlarged end 13, and portion 24 adjacent to surface 36 and narrow end 15. Area 17 defines a gap between slots 16 and 18 and wall 42.

Figure 2A:
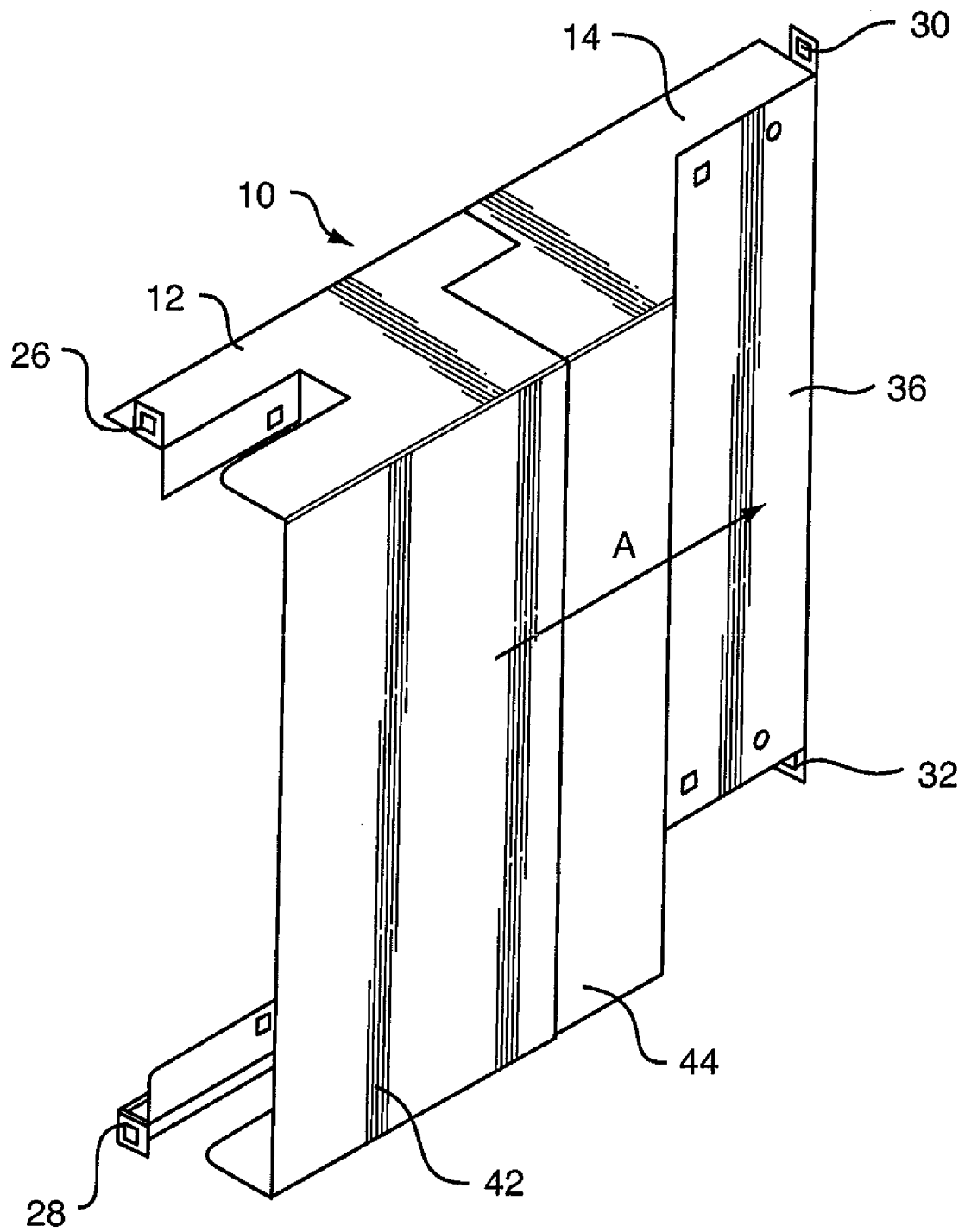
FIG. 2A is a perspective view of the modular air management scoop assembly of FIG. 1A, shown in a fully extended position.
Figure 2B:
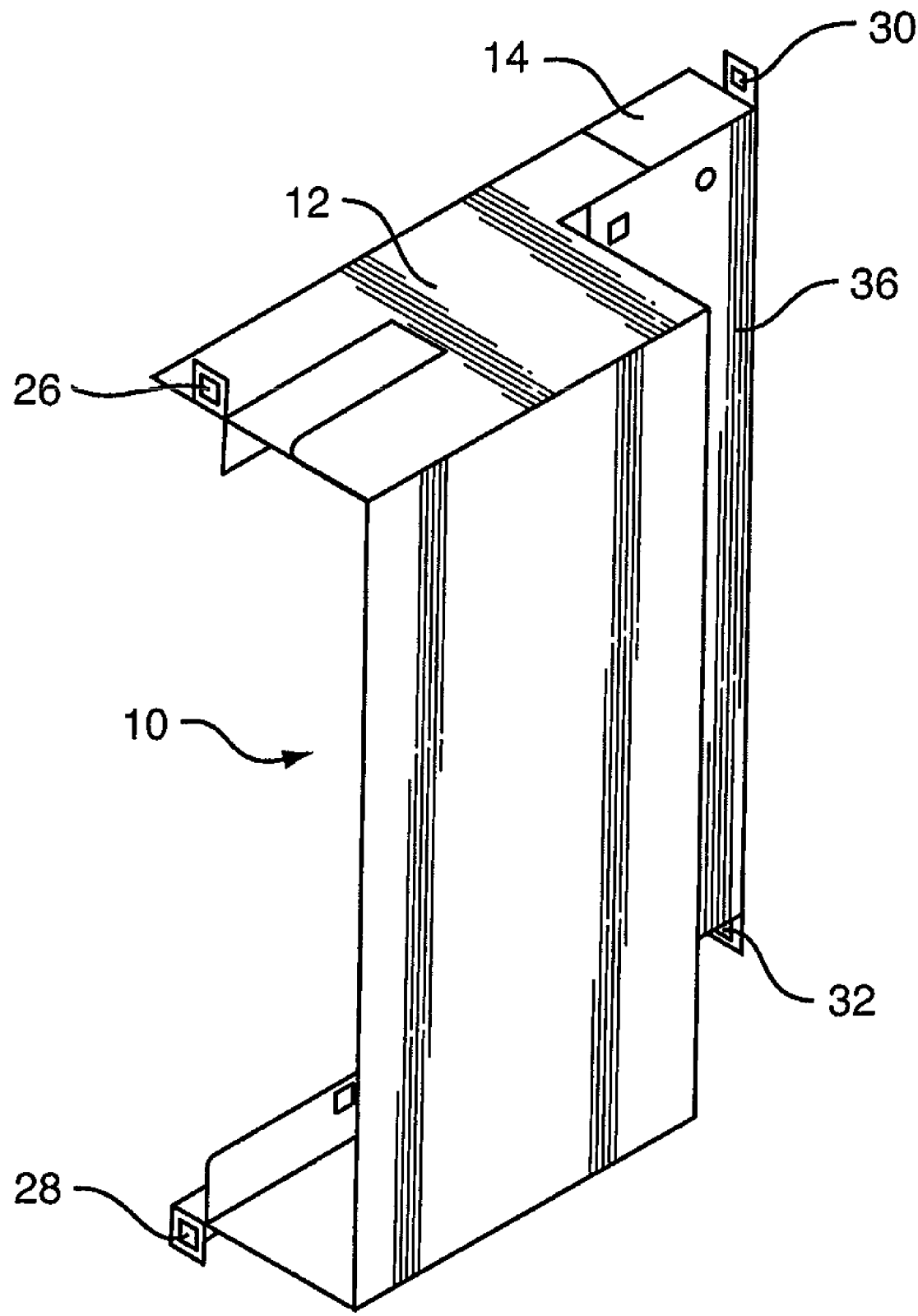
FIG. 2B is a perspective view of the modular air management scoop assembly of FIG. 1A, shown in a fully retracted position.

FIG. 1B illustrates the reversibility of the air management scoop assembly. Air management scoop assembly 10A, shown in FIG. 1B, is of the exact same construction as air management scoop assembly 10. FIG. 1A shows air management scoop assembly 10 in a first orientation, with enlarged end 13 facing the front of the cabinet or enclosure, and FIG. 1B shows air management scoop assembly 10a in a second orientation, with narrow end 15 facing the front of the cabinet or enclosure, FIGS. 2A and 2B illustrate the ability of air management scoop assembly 10 to be adjusted for use in enclosures with different spacing between the front and rear mounting rails. FIG. 2A shows air management scoop assembly 10 in a fully extended position, and FIG. 2B shows air management scoop assembly 10 in a fully retracted position. When fully retracted, rear wall 42 fits over rear wall 44. In use, first scoop portion 12 and second scoop portion 14 may slide relative to each other, as indicated by reference arrow A, thereby adjusting the distance between front and rear mounting tabs 26 and 30, and 28 and 32. Interlock structure 48 allows scoop portions 12 and 14 to slide while maintaining the structural integrity of air management scoop assembly 10. In a preferred embodiment, interlock structure 48 is a "pin and rail" system, where one half of the interlock structure comprises a rail with a hole, and the second half of the interlock structure comprises a rail with a slot, such that when a screw or pin is passed through the hole and into the slot, the pin can be slid to either end of the slot, but no further.

Figure 3:
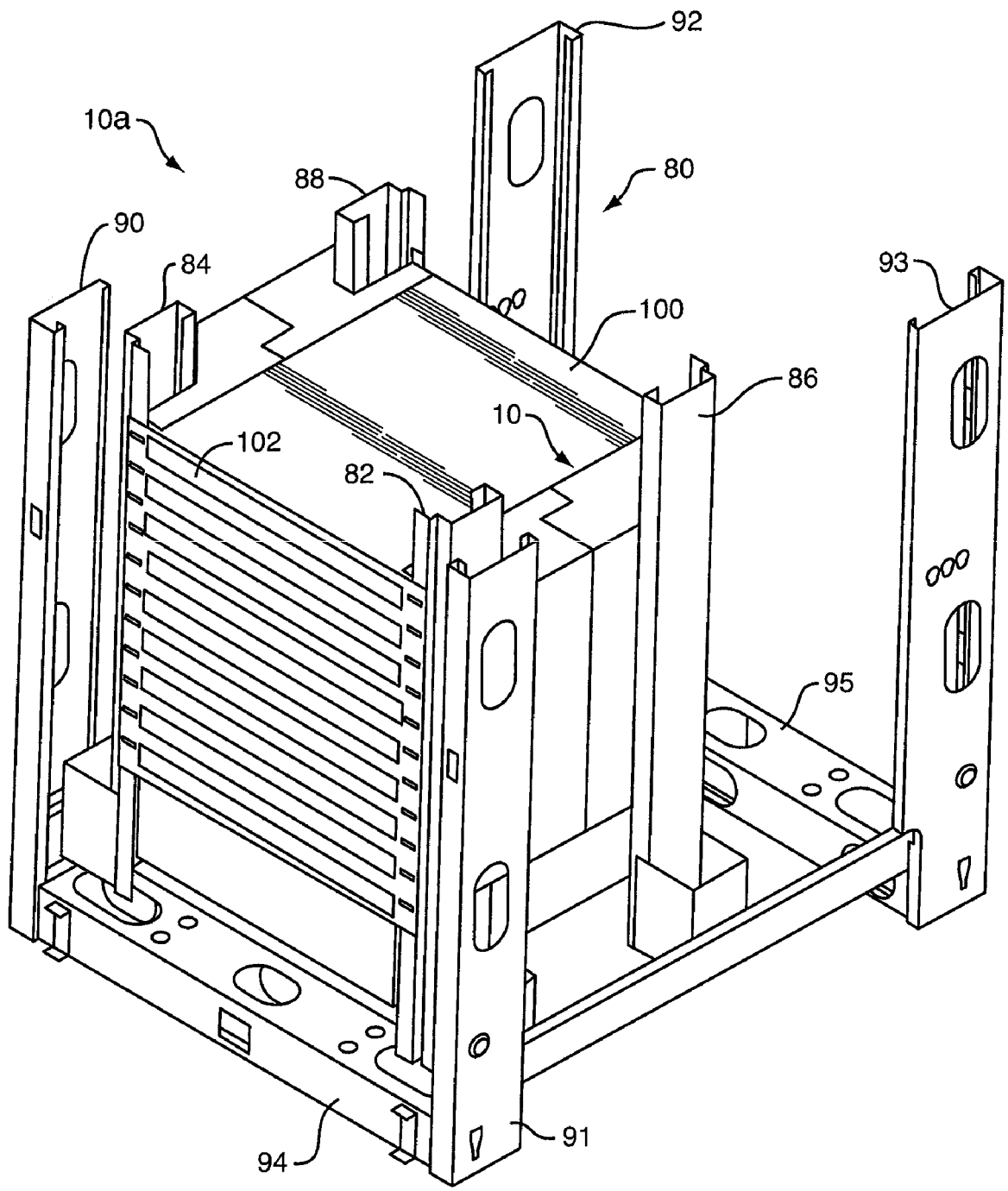
FIG. 3 is a perspective view of two modular air management scoop assemblies, as shown in FIGS. 1A and 1B, mounted within an enclosure, together with a "side by side" breathing electronic device.

As shown in FIG. 3, a "side-to-side" breathing device 100 with front panel 102 may be mounted in enclosure 80, together with air management scoop assembly 10 and air management scoop assembly 10a. Enclosure 80 comprises front enclosure structural members 90 and 91, rear enclosure structural members 92 and 93, and horizontal enclosure structural members 94 and 95. Enclosure 80 further comprises rails 82 and 84, located proximate the front of enclosure 80, and rails 86 and 88, located proximate the rear of enclosure 80.

As previously described, air management scoop assembly 10a is of the exact same construction as air management scoop assembly 10, but simply turned around such that narrow end 15 faces the front of the cabinet or enclosure. In this non-limiting embodiment, cool air will enter the front of air management scoop assembly 10 and be drawn into the right side of device 100, and heated air will exit the left side of device 100 and be directed toward the back of the enclosure 80 by air management scoop assembly 10a.

With further reference to FIGS. 1A and 3, rail 82 of enclosure 80 fits into slots 16 and 18 of air management scoop assembly 10. Similarly, and with reference to FIGS. 1B and 3, rail 88 of enclosure 80 fits into the same slots 16 and 18 of air management scoop assembly 10a. Rails 86 and 84 rest against surface 36 adjacent the narrow ends of adjustable air management scoop assemblies 10 and 10a, respectively.

Figure 4A:
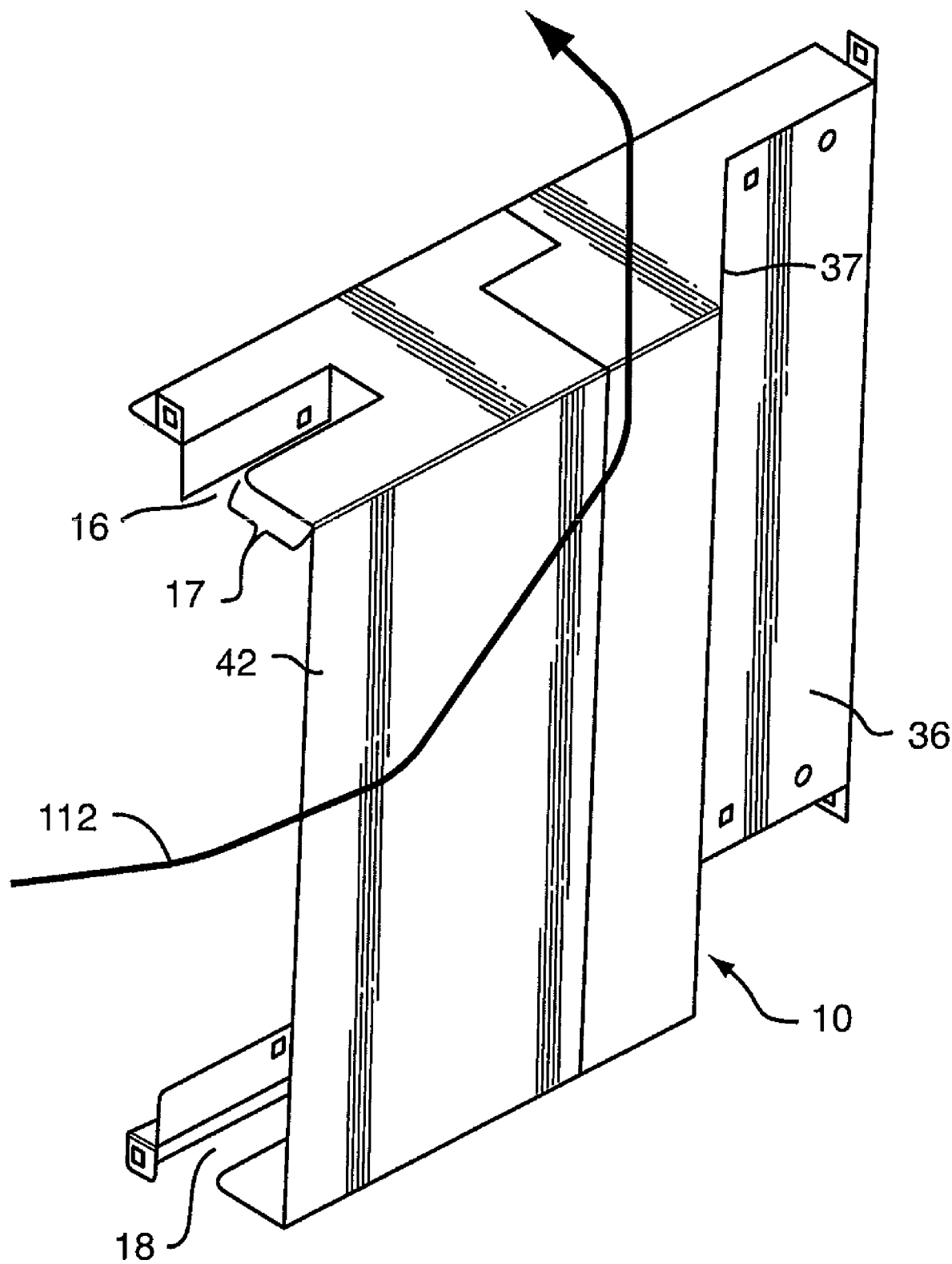
FIGS. 4A and 4B illustrate the air flow through the enclosure and modular air management scoop assemblies of FIG. 3.
Figure 4B:
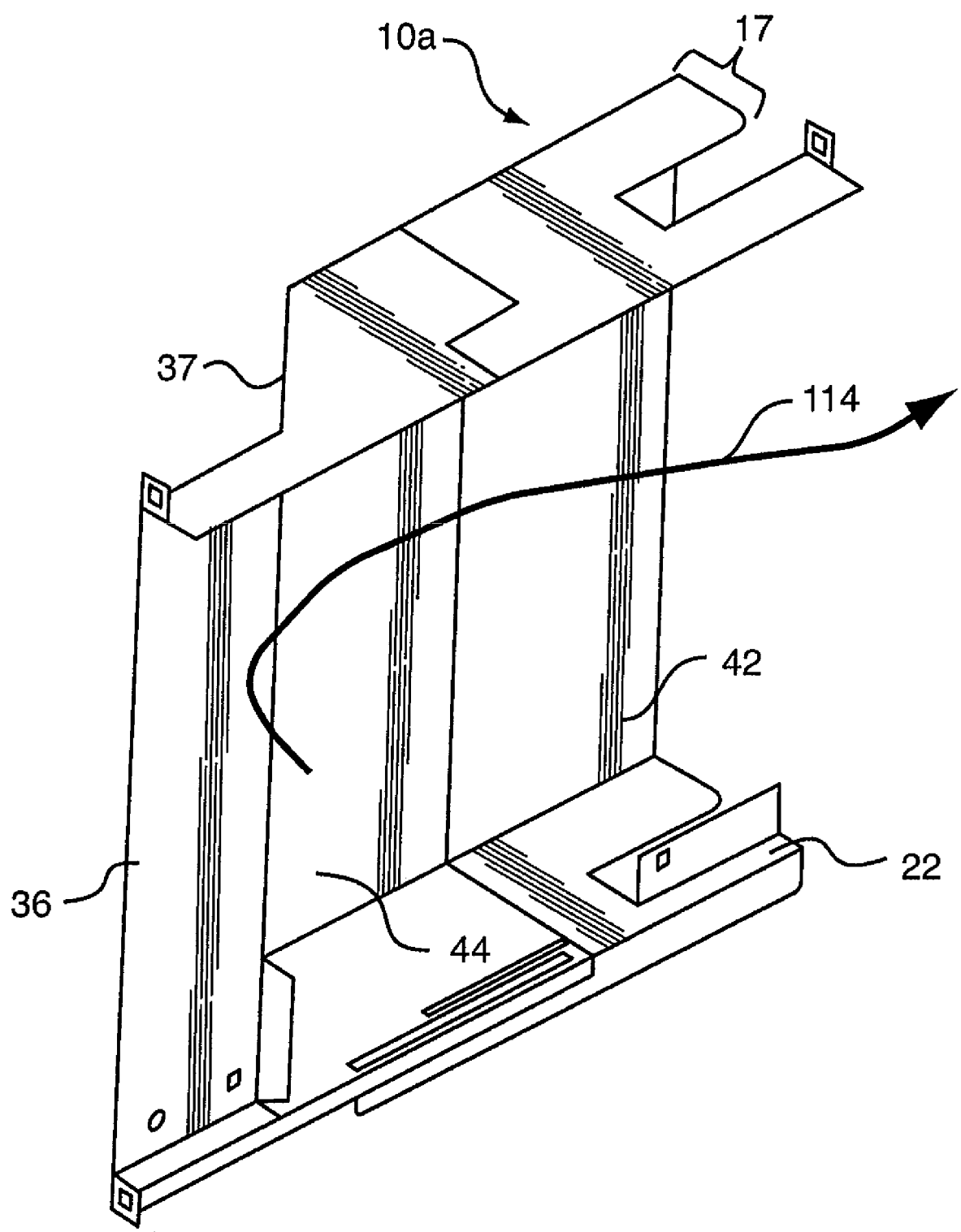

FIGS. 4A and 4B illustrate the flow of air through enclosure 80 and air management scoop assemblies 10 and 10a, in which cool air flow is indicated by reference arrow 112 and warm air flow is indicated by reference arrow 114. Cool air 112 enters the gap defined in area 17 between slots 16 and 18 and wall 42 of air management scoop assembly 10. As electronic device 100 sits against wall 36, the air flow is directed by angled wall 37 into the right side of electronic device 100. Heated air exiting electronic device 100 into the cavity between air management scoop assembly 10a and device 100 is directed by wall 37 of air management scoop assembly 10a out back through area 17, into the back of enclosure 80.

As shown in FIG. 5, electronic device 100 may be hot-swapped out of enclosure 80. As described above, device 100 rests on shelf portion 47 of air management scoop assemblies 10 and 10a, and thus may be slid into and out of enclosure 80.

Figure 6A:
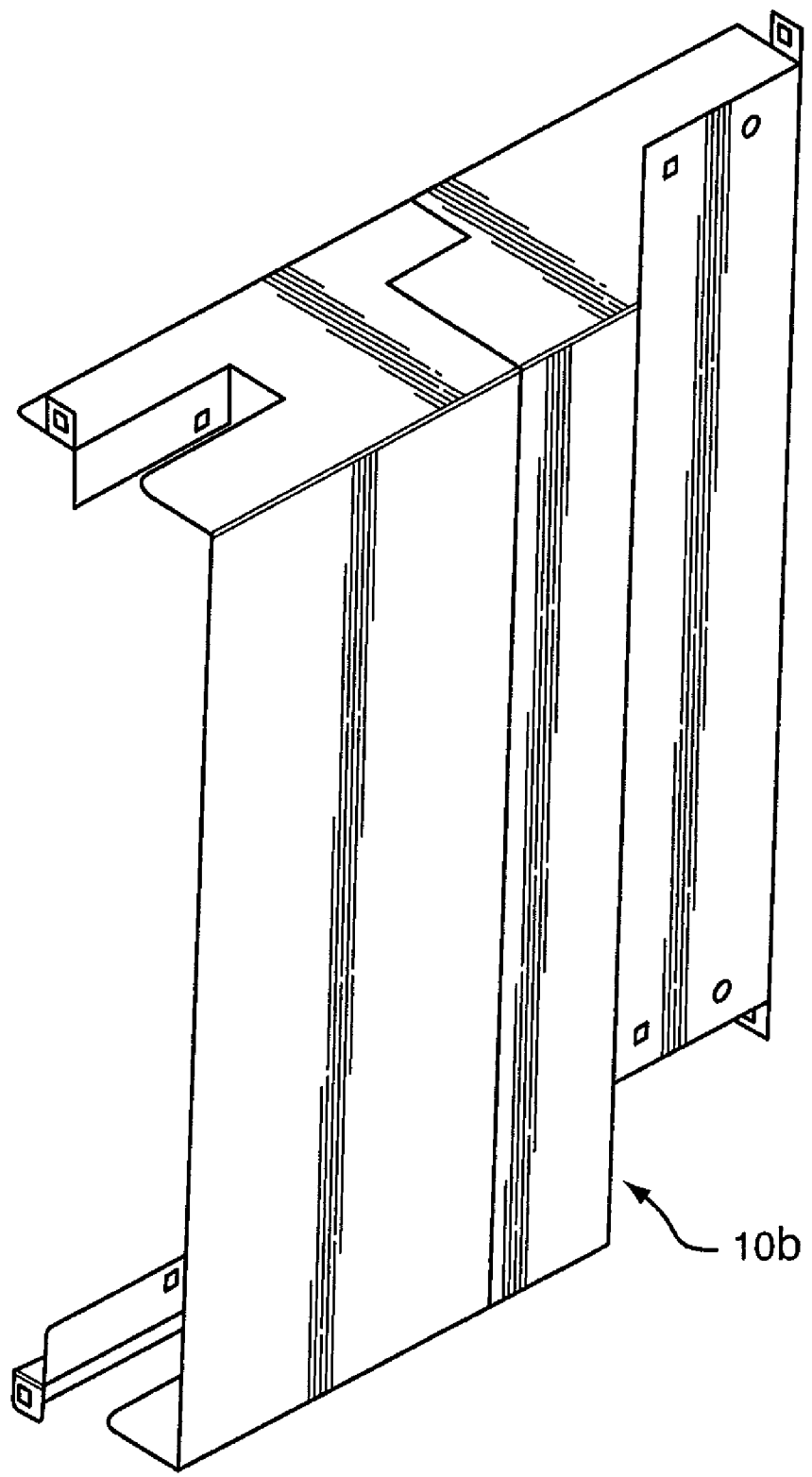
FIGS. 6A, 6B and 6C are perspective views of alternative embodiments of the modular air management scoop assembly of FIG. 1A.
Figure 6B:
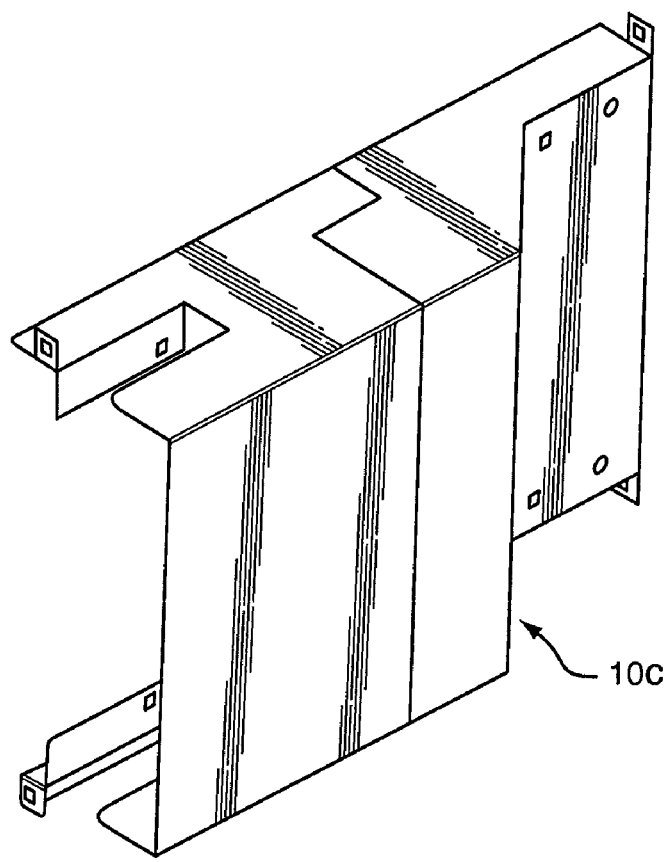
Figure 6C:
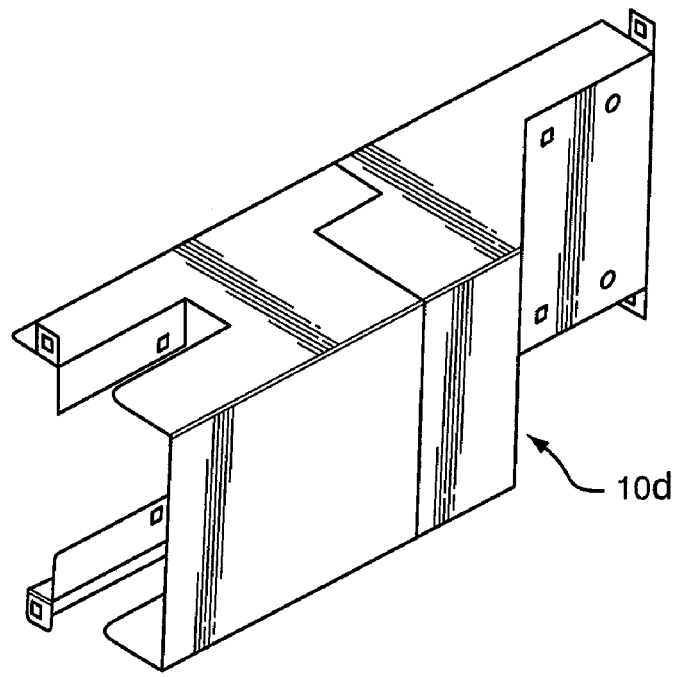

As shown in FIGS. 6A, 6B, and 6C, air management scoop assembly 10 may be constructed in different heights and widths, to accommodate a particular electronic device and/or a particular enclosure. In a preferred embodiment, air management scoop assembly 10 is constructed of bent and formed sheet metal.

Figure 7A:
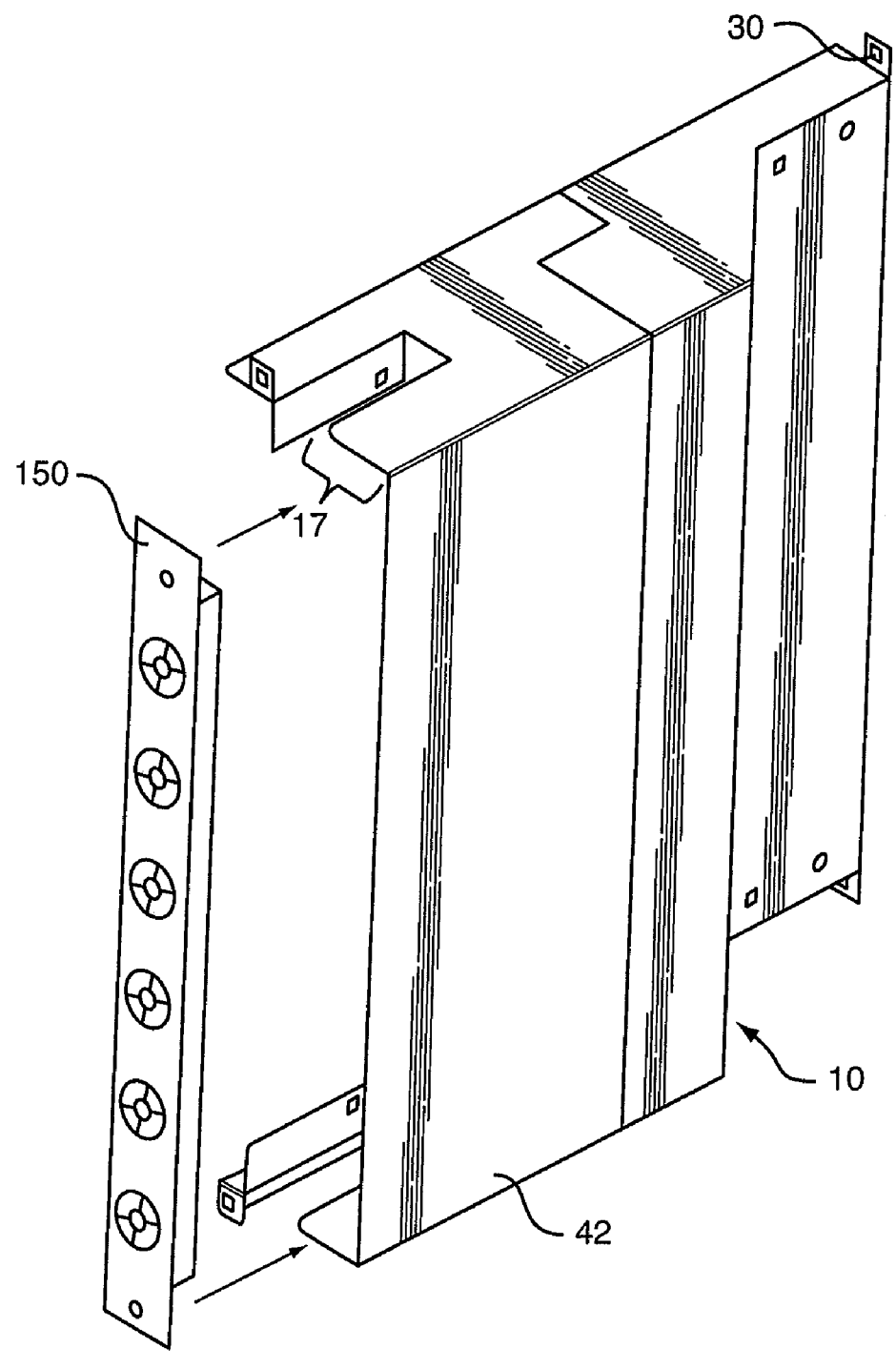
FIGS. 7A, 7B and 7C illustrate the addition of fan trays to the modular air management scoop assembly of FIG. 1A.
Figure 7B:
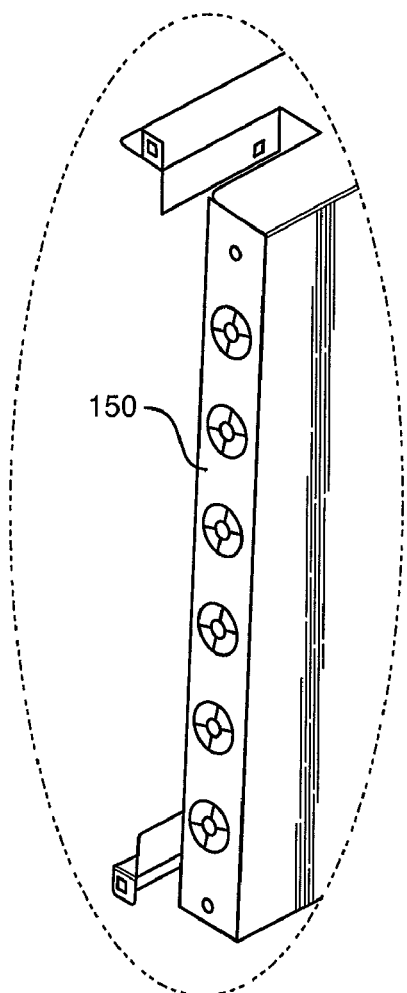
Figure 7C:
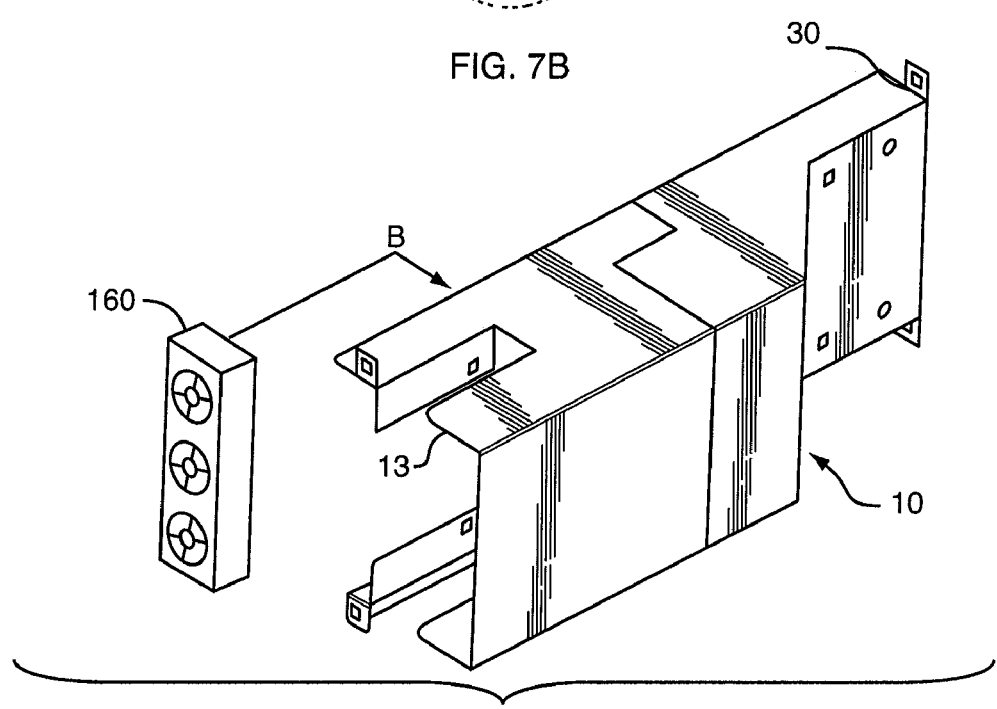

As shown in FIGS. 7A, 7B and 7C, fan trays may be added to the air management scoop assembly to provide additional air flow within the enclosure. FIGS. 7A and 7B show an air management scoop assembly 10 in which fan tray 150 is placed in the opening along area 17. Alternatively, and as shown in FIG. 7C, fan tray 160 can be placed within air management scoop assembly 10 at approximately the location indicated by reference arrow B, which is approximately four to five inches back from the location at which fan tray 150 is placed in FIG. 7A. Since air management scoop assembly 10 is deeper at the location indicated by reference arrow B, fan tray 160 can accommodate larger fans than fan tray 150, and allow for greater air movement. Note that while both fan trays 150 and 160 may be used, only one fan tray would be used in a typical installation.

Modular Air Management Tray Assembly

Figure 8:
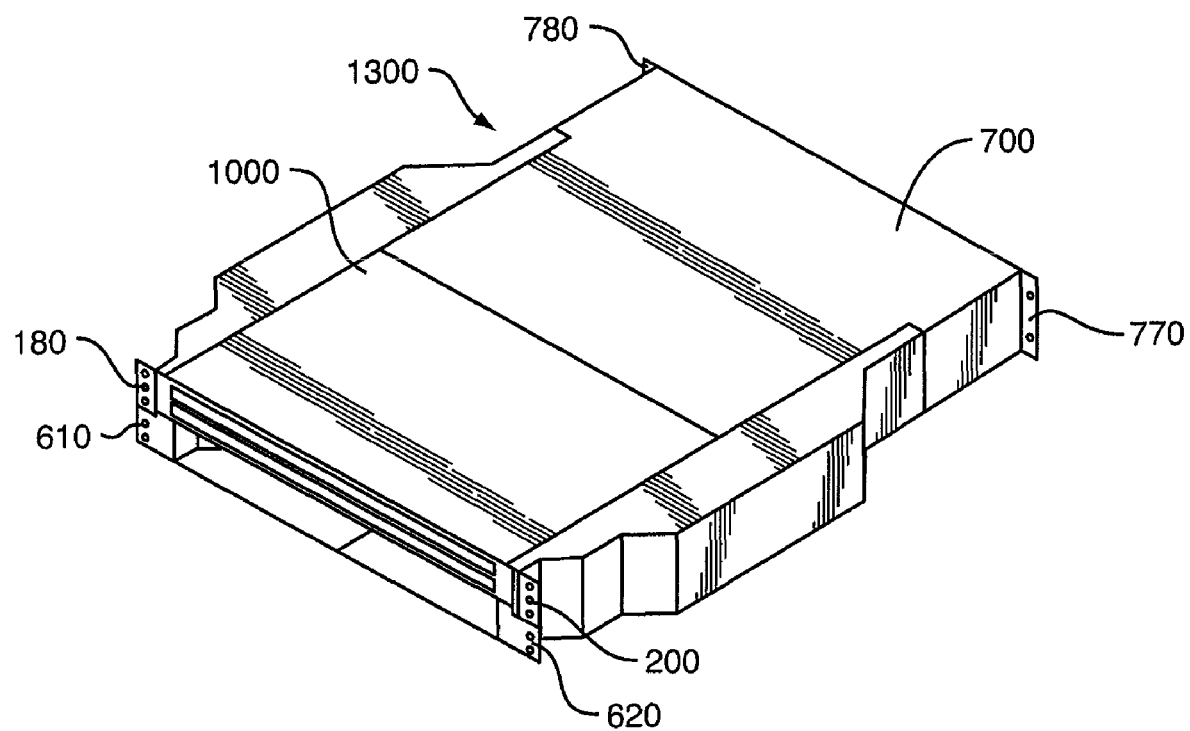
FIG. 8 is perspective view of a modular air management tray assembly, according to an additional preferred embodiment of the invention.
Figure 14A:
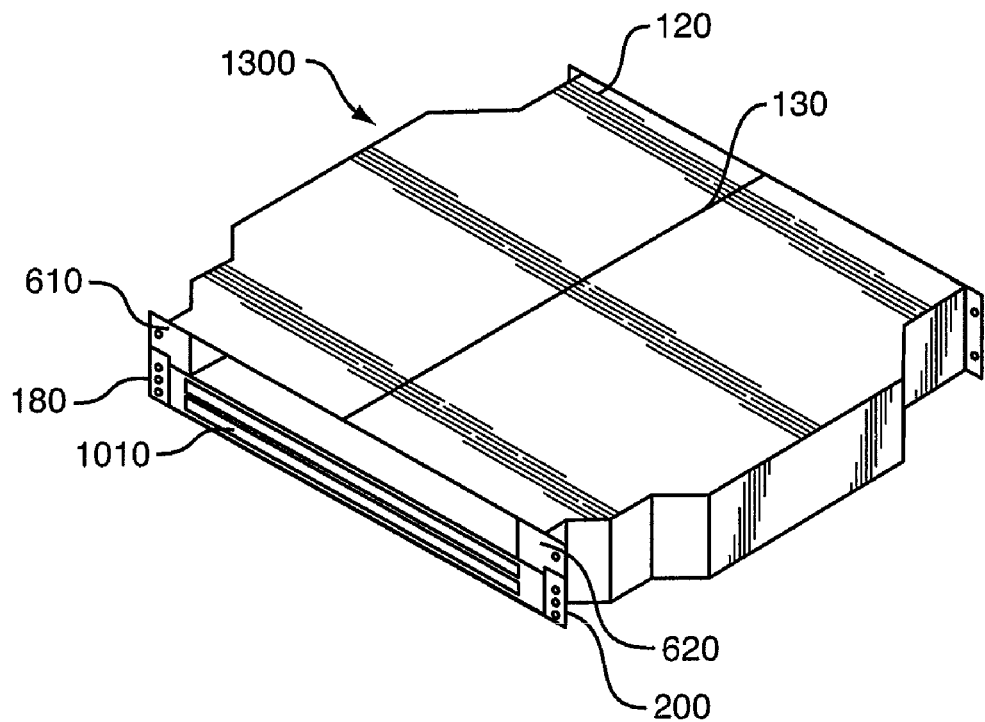
FIGS. 14A and 14B illustrate the modular air management tray assembly of FIG. 8 installed upside down, with the electronic device on the bottom.

In an additional preferred embodiment, and as shown in FIG. 8, the invention further comprises an air management tray assembly 1300 for use with a side inlet, rear exhaust electronic device 1000 in a "front-to-back" air-distributed enclosure. Air management tray assembly 1300 is designed to be coupled to the rails of an enclosure or cabinet. Air management tray assembly 1300 directs heated air from the sides of an electronic device to the back or front of the enclosure. Air management tray assembly 1300 is reversible, such that it may be mounted front to back, or back to front, and/or mounted with the electronic device 1300 on the top, as shown in FIG. 8, or with the electronic device on the bottom, as shown in FIG. 14A. Air management tray assembly 1300 also supports the electronic device within the enclosure, and allows the electronic device to be hot-swapped out of the enclosure. In a preferred embodiment, air management tray assembly 1300 is constructed of bent and formed sheet metal.

Figure 9:
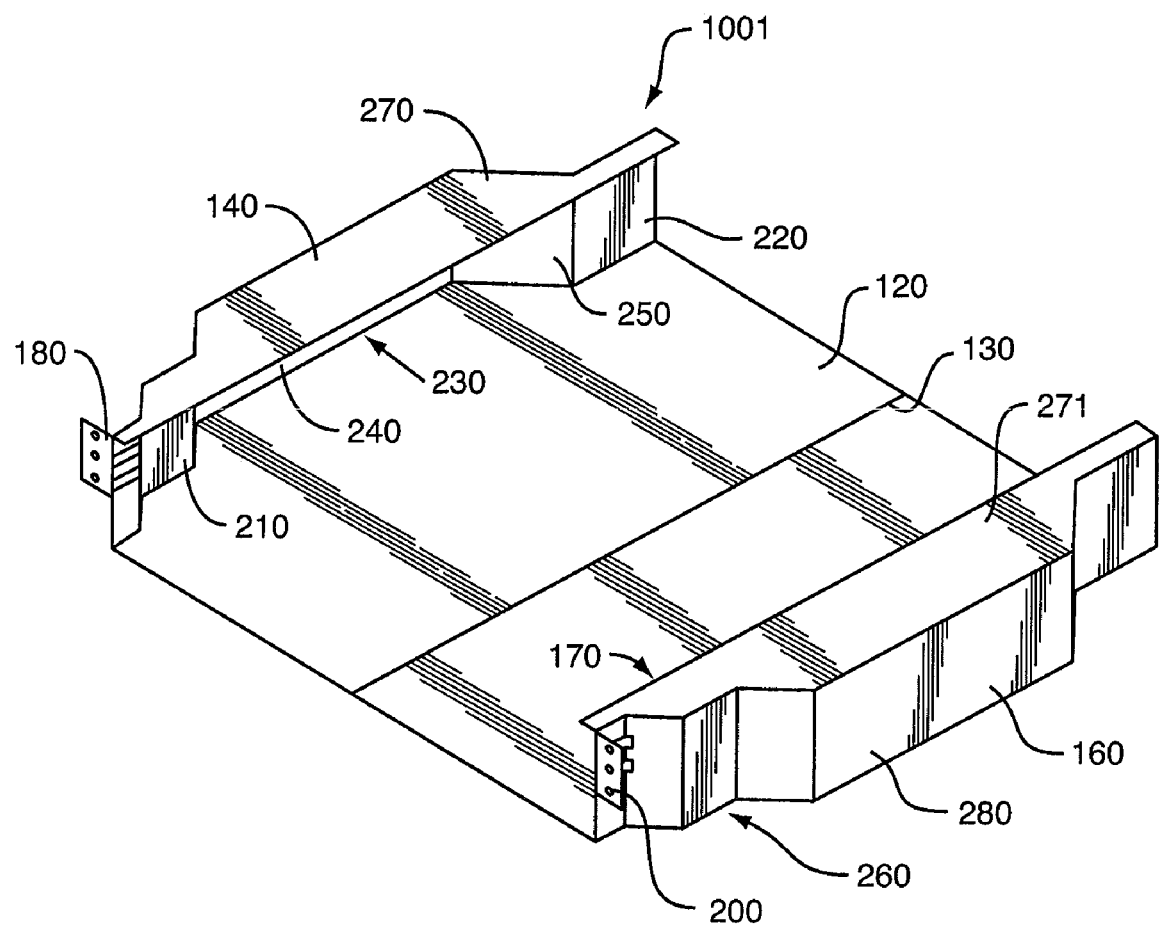
FIG. 9 is a perspective view of an exhaust deflector shelf of the modular air management tray assembly of FIG. 8.
Figure 10:
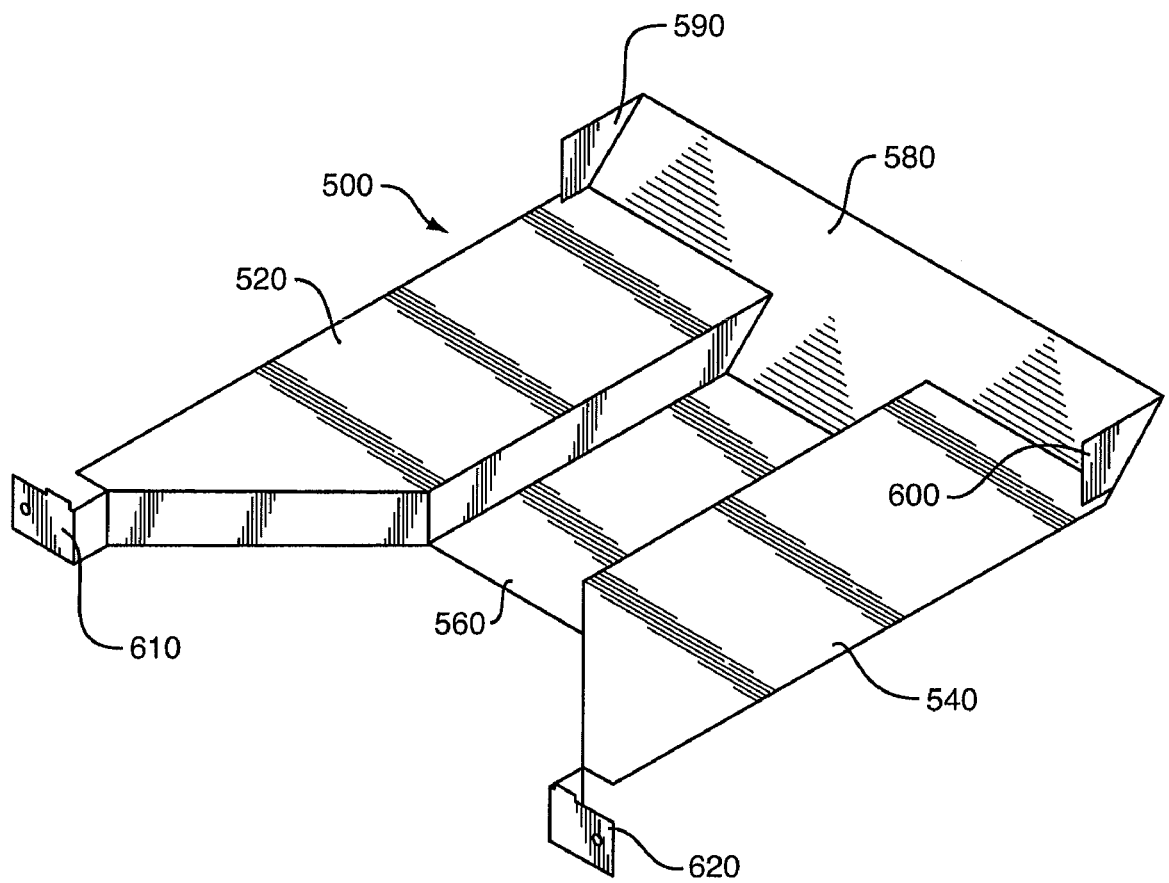
FIG. 10 is a perspective view of an apparatus tray of the modular air management tray assembly of FIG. 8.
Figure 11:
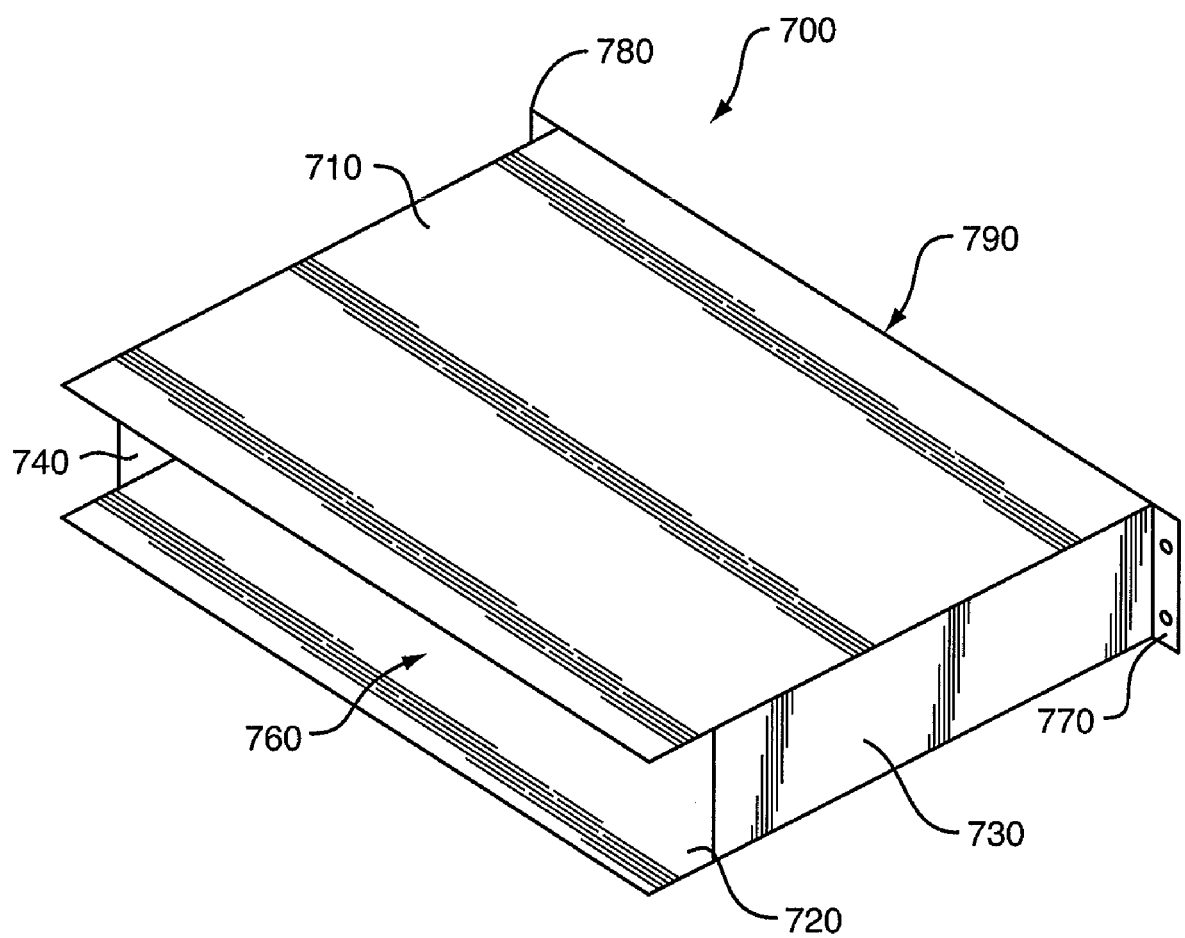
FIG. 11 is a perspective view of an adjustable intake tunnel of the modular air management tray assembly of FIG. 8.

With further reference to FIG. 8, and as shown in FIGS. 9, 10, and 11, air management tray assembly 1300 comprises two or three components: exhaust deflector shelf 1001 (FIG. 9), apparatus tray 500 (FIG. 10), and optional adjustable intake tunnel 700 (FIG. 11).

With further reference to FIG. 9, exhaust deflector shelf 1001 comprises flat shelf bottom 120, which may optionally have seam 130. Seam 130 is present in an embodiment in which exhaust deflector shelf 1001 is made in two inter-fitting pieces that are bilaterally symmetrical about seam 130. This construction allows the user to install exhaust deflector shelf 1001 in a completely full rack, and does not consume any more space than the 2 U rack spaces taken up by air management tray assembly 1300. Installation is accomplished by installing the left half of exhaust deflector shelf 1001, then installing the right half of exhaust deflector shelf 1001, and forming the "seam" where the two halves inter-fit or overlap. If the exhaust deflector shelf 1001 is made in one part, the user would need to tilt the exhaust deflector shelf 1001 at an angle to fit it into the rack, and an adjacent rack U space would be required to install the air management tray assembly 1300.

With further reference to FIG. 9, exhaust deflector shelf 1001 further comprises left and right protrusions 140 and 160, respectively, which create left and right internal chambers 230 and 170, respectively. Protrusions 140 and 160 are mirror images of each other, as are chambers 230 and 170. The chambers are accomplished with left inner parallel walls 210 and 220 and corresponding right inner parallel walls (not shown), outermost walls 240 and 280, upper walls 270 and 271, and shelf bottom 120. The inner walls of the chambers are offset from the outer walls of the chambers. This offset is created by stepped area 260 and angled wall 250, which provide the depth necessary to create chambers 230 and 170.

With further reference to FIG. 10, apparatus tray 500 is sized and shaped to sit on shelf bottom 120 and butt up against left inner parallel walls 210 and 220 and corresponding right inner parallel walls. Apparatus tray 500 comprises left shelf 520 and right shelf 540, which are spaced above lower wall 560. Shelves 520 and 540 are mirror images of each other. Rear angled wall 580 extends upwardly and outwardly from the rear of shelves 520 and 540, and is bounded by left and right wall end members 590 and 600, respectively. Left and right side mounting brackets, 610 and 620, respectively, allow apparatus tray 500 to be coupled to an interior rail in an enclosure.

With further reference to FIG. 11, optional adjustable intake tunnel 700 comprises top 710, bottom 720, and sidewalls 730 and 740. Sidewalls 730 and 740 do not extend to the front of the top 710 and bottom 720 and thus create an offset for front opening 760 and rear opening 790. Rear opening 790 is bounded by right and left side mounting brackets 770 and 780, respectively, which allow adjustable intake tunnel 700 to be coupled to an interior rail in an enclosure.

Figure 12A:
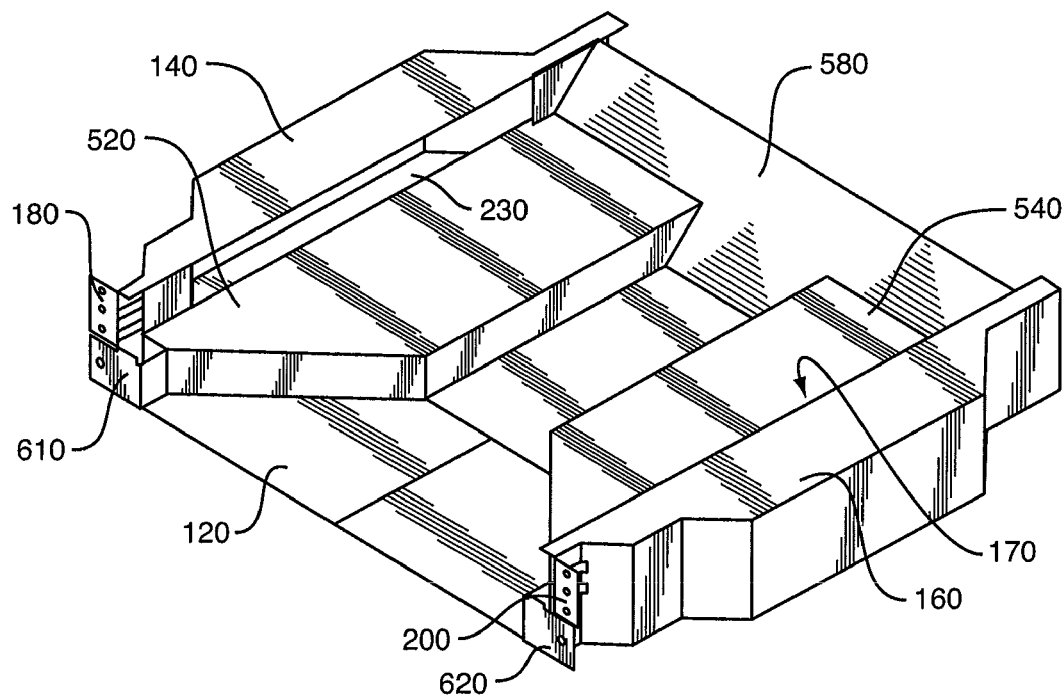
FIG. 12A is a perspective view of the apparatus tray of FIG. 10 mounted within the exhaust deflector shelf of FIG. 9.

As shown in FIG. 12A, air management tray assembly 1300 is assembled by first placing apparatus tray 500 on exhaust deflector shelf 1001 such that apparatus tray 500 sits on shelf bottom 120 with brackets 610 and 620 located coplanar with and just below brackets 180 and 200, respectively. This arrangement allows for fluid communication between the newly created chambers or cavities between shelves 520 and 540, shelf bottom 120, and chambers 230 and 170, respectively. As the chambers below shelves 520 and 540 communicate with the back area behind rear wall 580, this arrangement allows air flow to or from the area behind wall 580 into and through chambers 230 and 170.

Figure 12B:
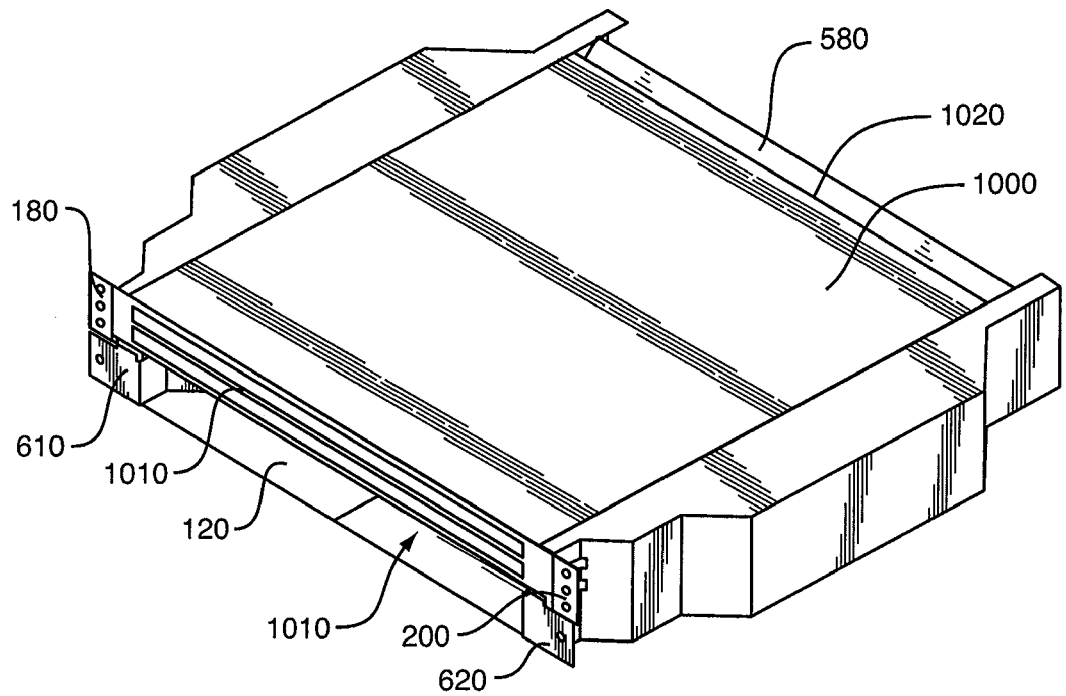
FIG. 12B is a perspective view of the apparatus tray and exhaust deflector shelf of FIG. 12A used with a non-"front-to-back" breathing electronic device.

As shown in FIG. 12B, when electronic device 1000 is placed down on top of apparatus tray 500, it sits on shelves 520 and 540 with its front 1010 proximate brackets 180, 200, 610 and 620, and a front intake or exhaust gap 1030 is created between the bottom of device 1000 and shelf bottom 120. Similarly, an air flow gap is accomplished by the space defined between rear 1020 of device 1000 and the top portion of rear wall 580. The air management tray assembly 1300, therefore, is configurable, and allows cool air to be taken in either through front gap 1030 or rear opening 790.

In some embodiments, and as shown in FIGS. 8, and 15A through 15C, adjustable air tunnel 700 may be used to create an adjustable length rear plenum. With reference to FIG. 11, electronic device 1000 is placed inside the front area of adjustable intake tunnel 700, into front opening 760, and adjustable intake tunnel 700 can be slid relative to electronic device 1000 and shelf 1001. This arrangement allows intake or exhaust air to be conducted to or from a desired location within the enclosure. Brackets 770 and 780 allow adjustable intake tunnel 700 to be coupled to the interior rails of the enclosure.

Figure 13A:
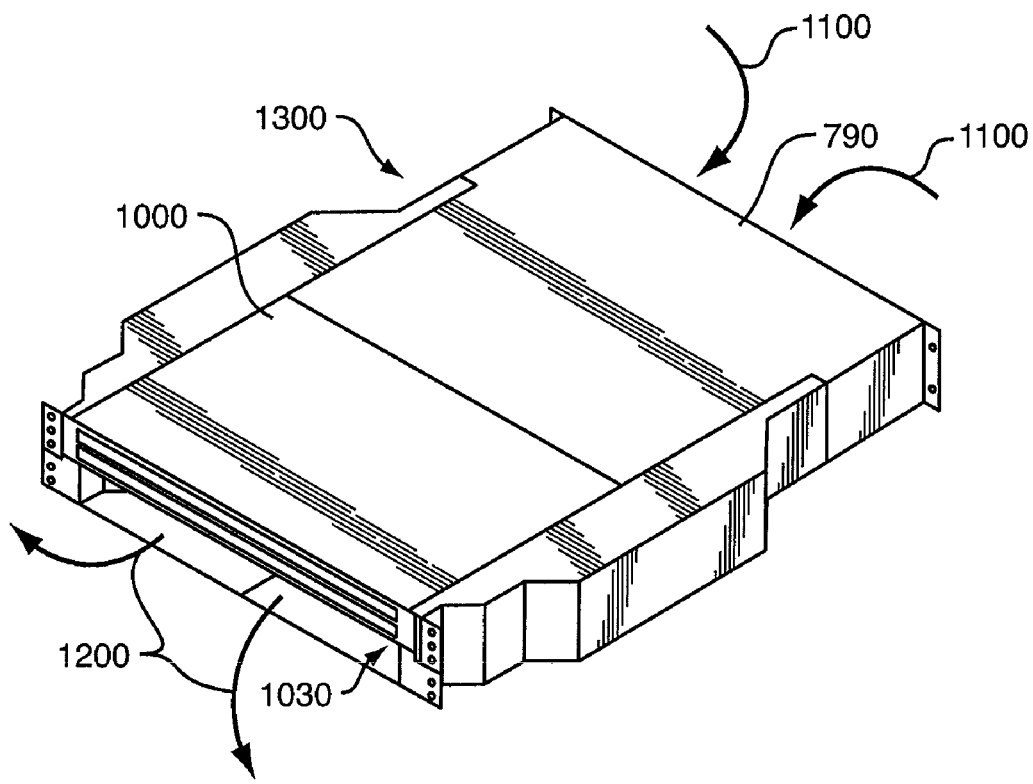
FIGS. 13A, 13B, 13C, 13D, 13E and 13F illustrate air flow patterns through the modular air management tray assembly of FIG. 8 when used with a side entry, rear exhaust electronic device, in which the modular air management tray assembly is installed "front to back"
Figure 13B:
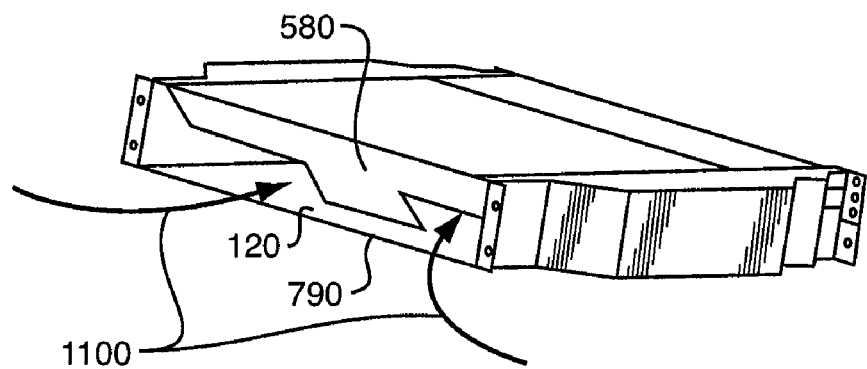
Figure 13C:
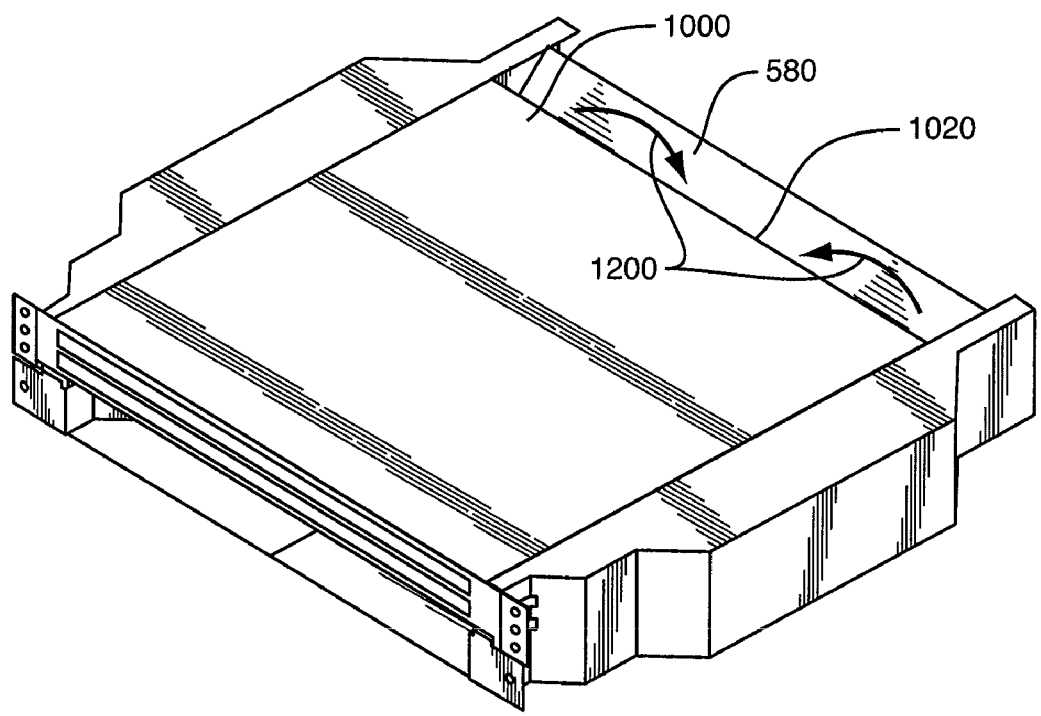
Figure 13D:
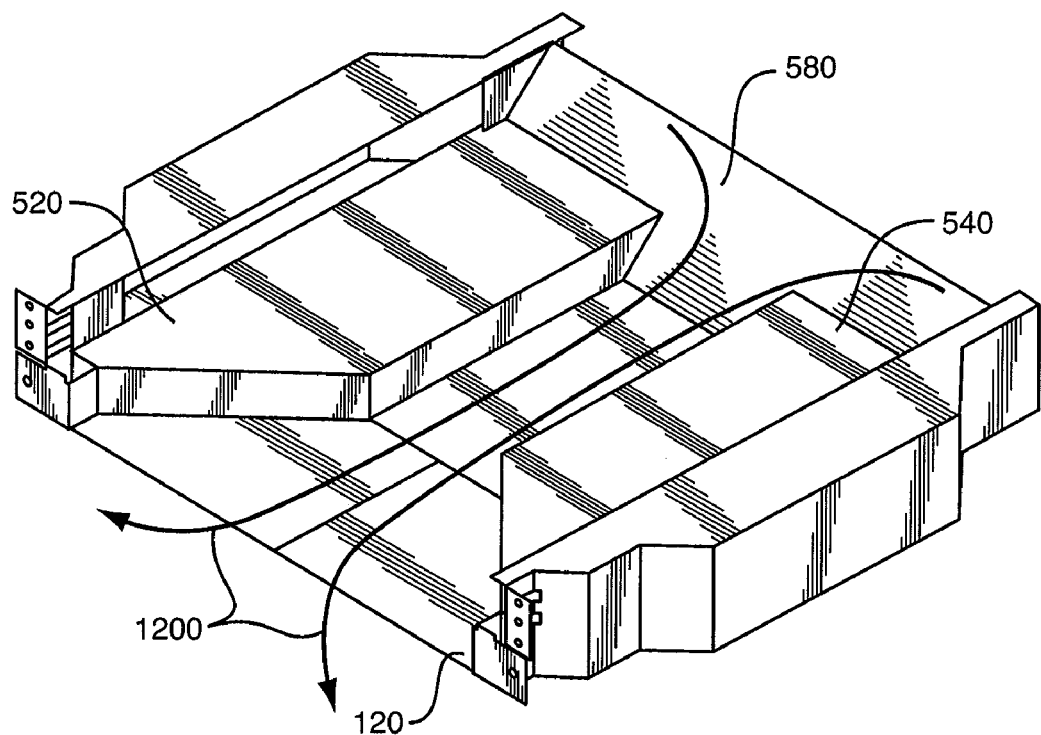
Figure 13E:
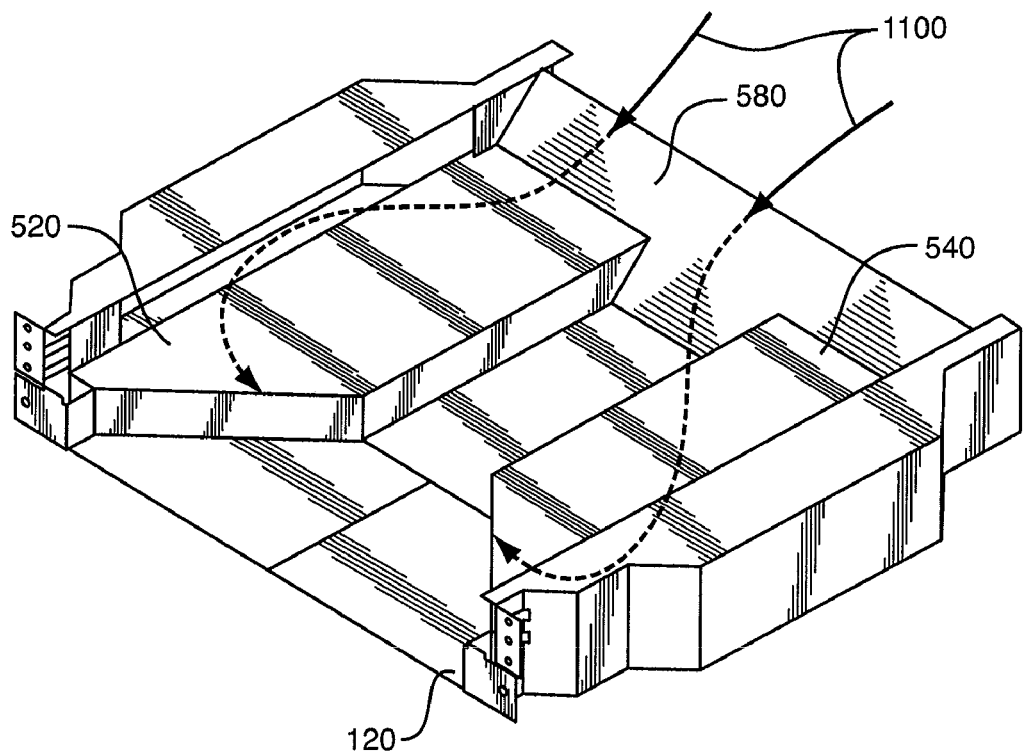
Figure 13F:
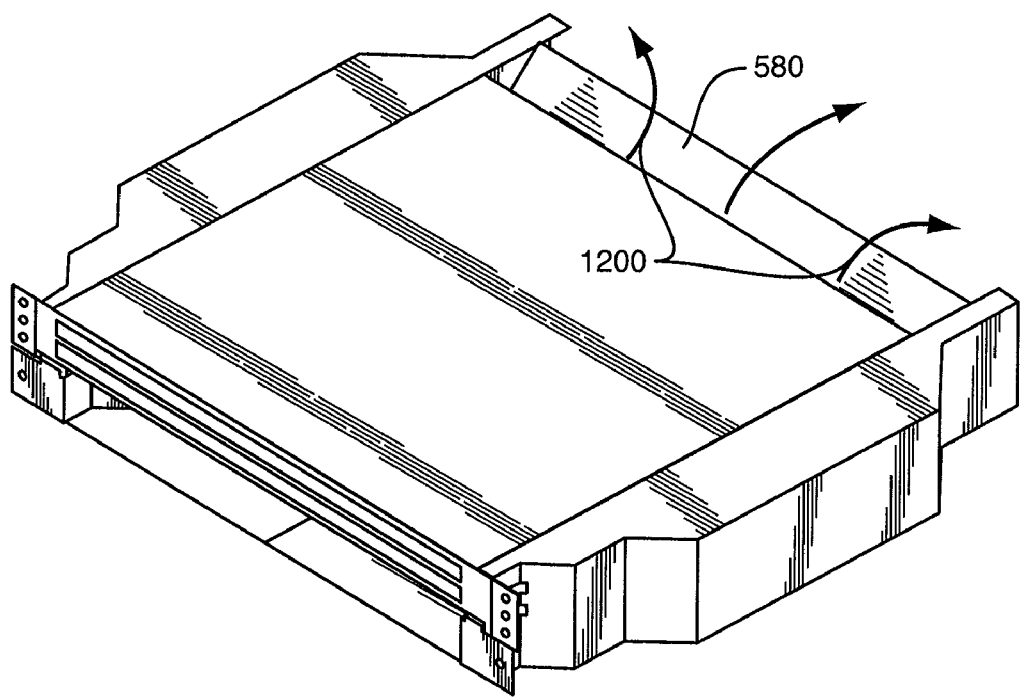

FIGS. 13A though 13F illustrate air flow paths through air management tray assembly 1300, in which cool air flow is indicated by reference arrow 1100 and warm air flow is indicated by reference arrow 1200. In the embodiments shown, electronic device 1000 is of the type that takes in cool air from both its left and right sides, and warm air is exhausted through the rear 1020 of electronic device 1000. As shown in FIGS. 13A and B, cool air 1100 enters through opening 790. As shown in FIG. 13E, cool air 1100 flows underneath rear wall 580 into the chambers below left and right shelves 520 and 540, then into chambers 170 and 230, where it enters the left and right sides of electronic device 1000. Heated exhaust air exiting rear 1020 of electronic device 1000 enters the area between the device rear 1020, rear wall 580 and top 710 of adjustable intake tunnel 700. The heated air then flows into the gap below device 1000 between shelves 520 and 540 and exits through front gap 1030, as shown in FIGS. 13C and D. If adjustable intake tunnel 700 is not used, heated air is directed backward and upward by angled wall 580, as shown in FIG. 13F.

Figure 14B:
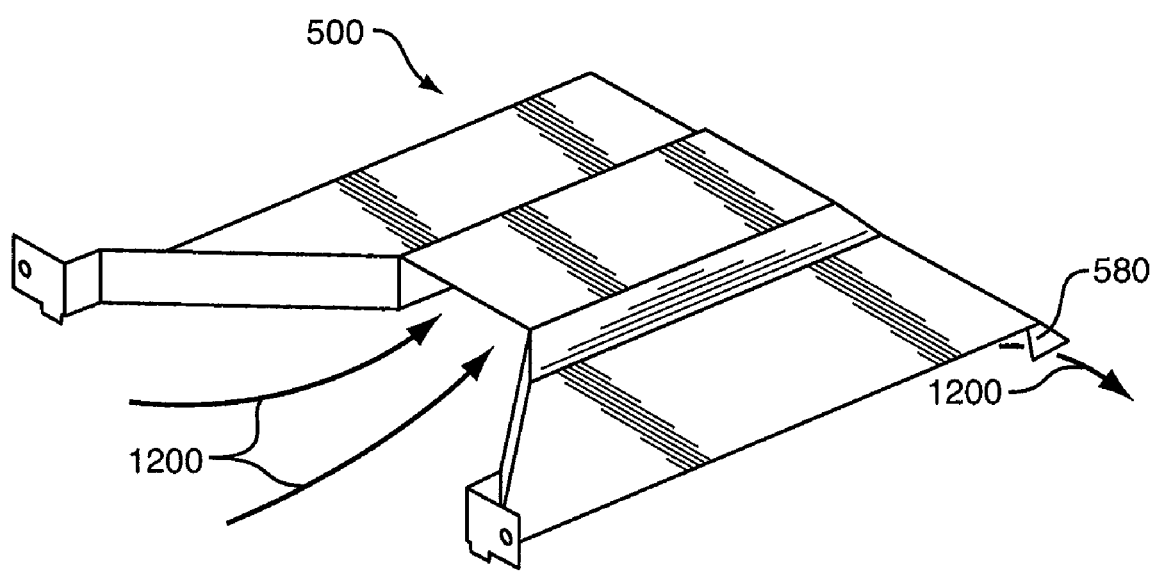
Figure 15A:
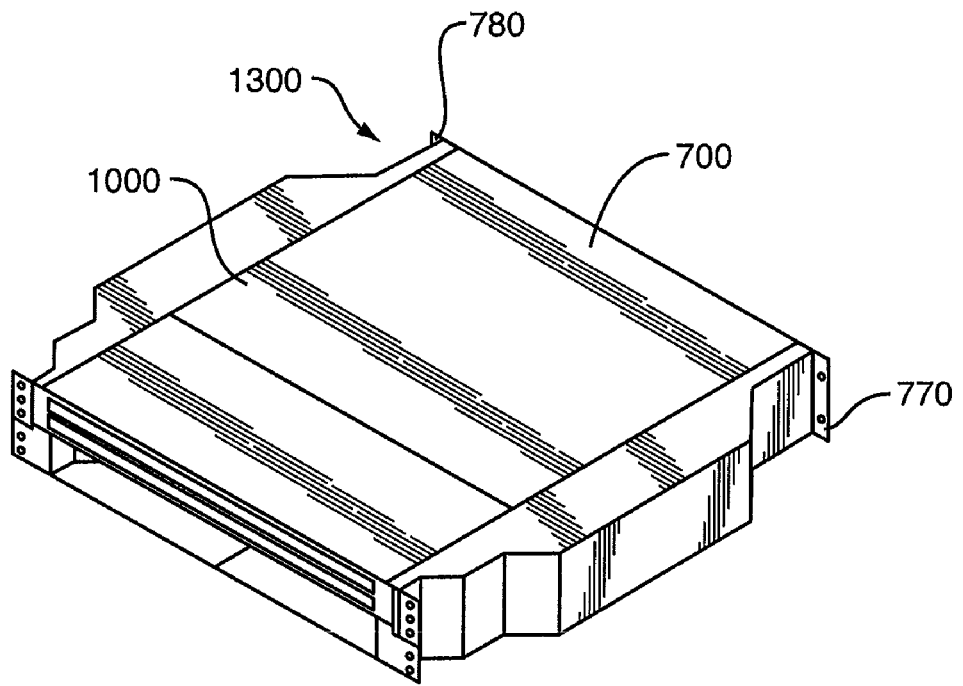
FIGS. 15A, 15B and 15C illustrate the use of the adjustable intake tunnel of FIG. 11 with an electronic device.
Figure 15B:
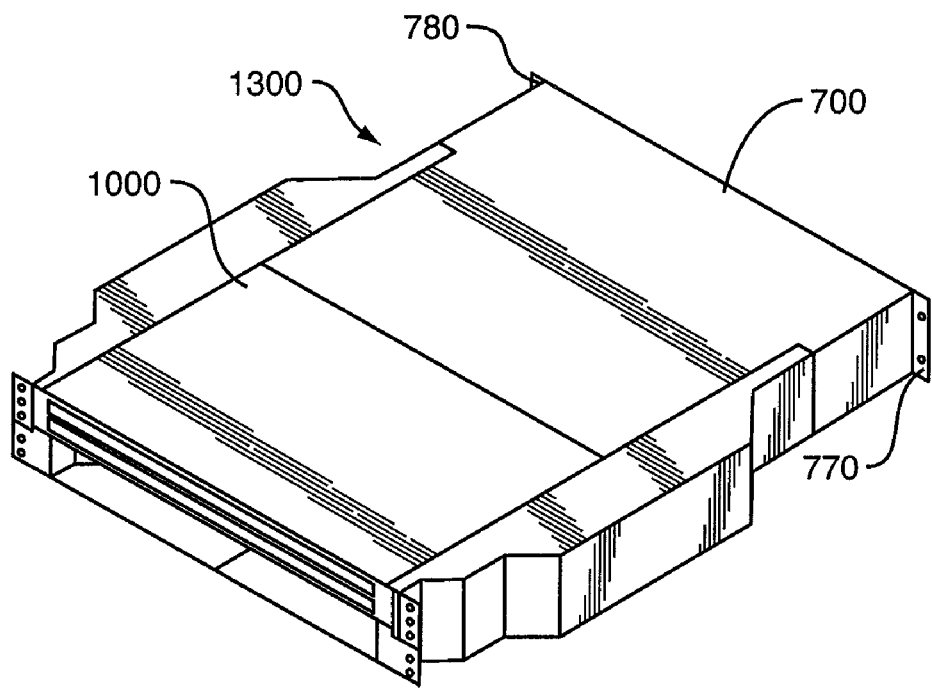
Figure 15C:
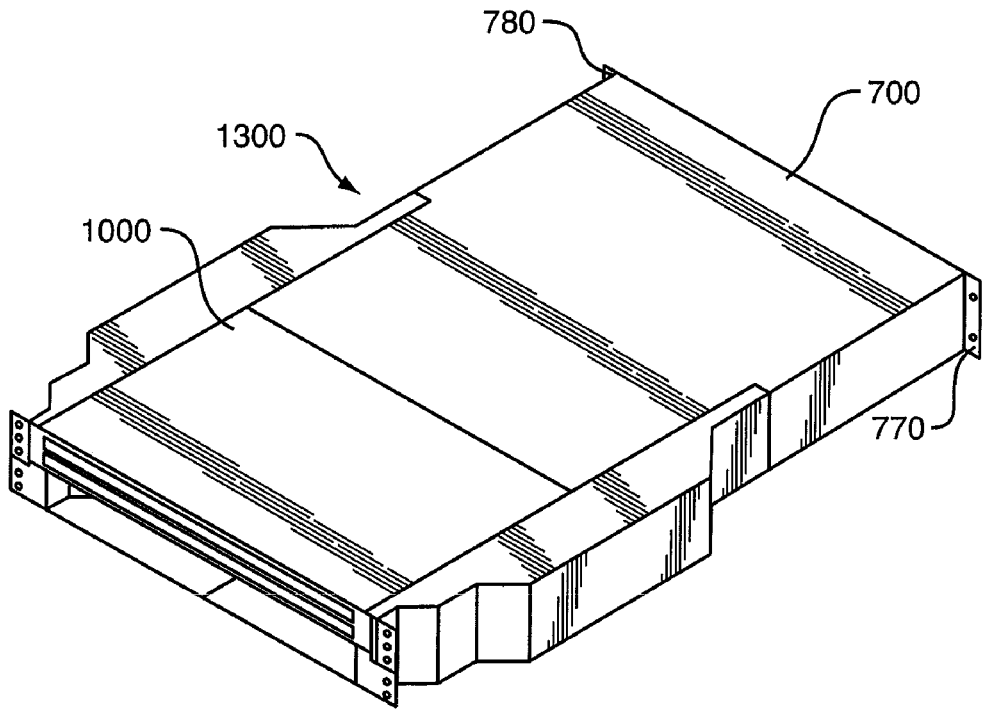
Figure 16:
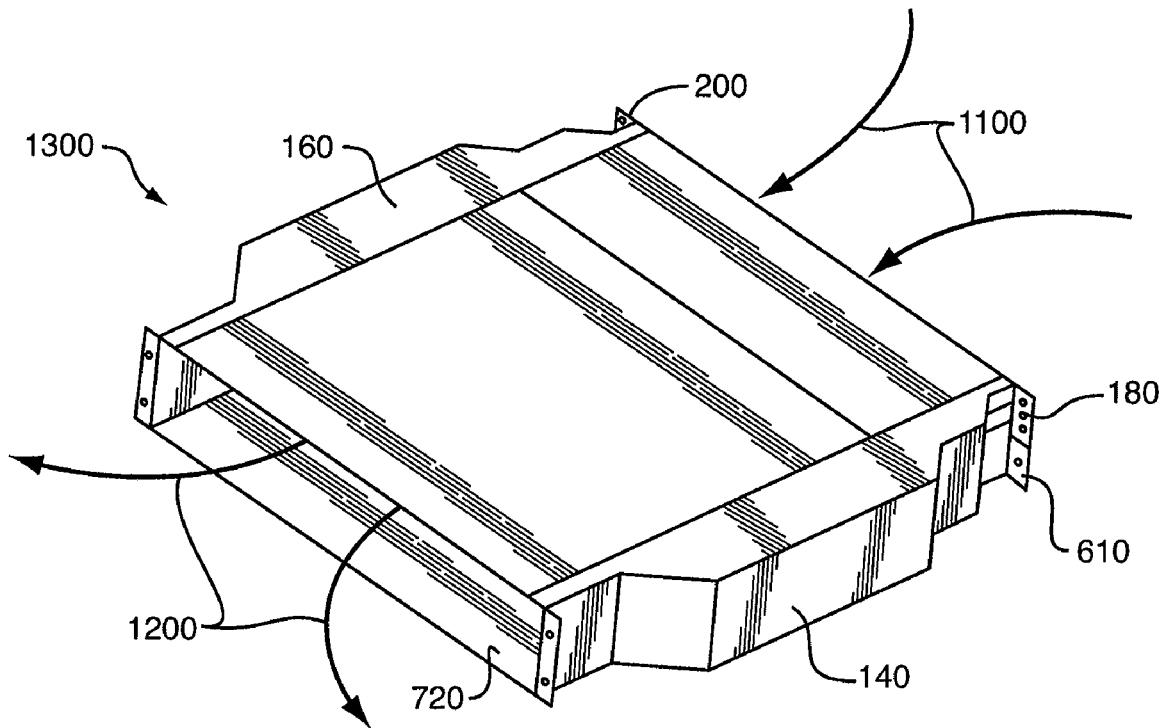
FIG. 16 illustrates the modular air management tray assembly of FIG. 8 installed "back to front"

Air management tray assembly 1300 may be installed "front to back" as shown in the embodiment of FIG. 13A, or "back to front," with the air flow in the opposite direction, as show in FIG. 16. In additional embodiments, air management tray assembly 1300 may be installed with electronic device 1000 on the top, as shown in the embodiment in FIG. 13A, or flipped upside down with electronic device 1000 on the bottom, as shown in the embodiment of FIG. 14A. As shown in FIG. 14B, when electronic device 1000 is mounted on the bottom, rear wall 580 is angled downwardly.

Figure 17:
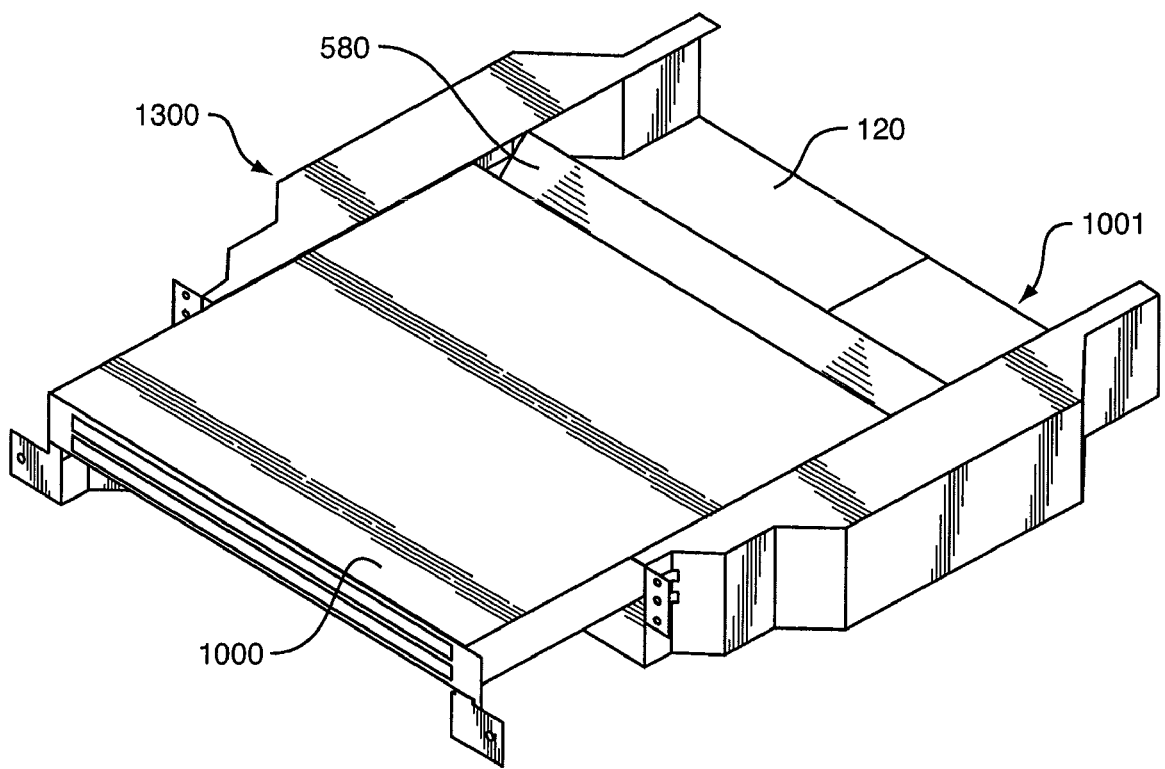
FIG. 17 illustrates the manner in which an electronic device can be slid into or out of the modular air management tray assembly of FIG. 8.

As shown in FIG. 17, air management tray assembly 1300 may be coupled to the interior rails of an enclosure, such that electronic device 1000 can be swapped out without disassembling the air management tray assembly 1300, by sliding out electronic device 1000 together with apparatus tray 500.

Figure 18:
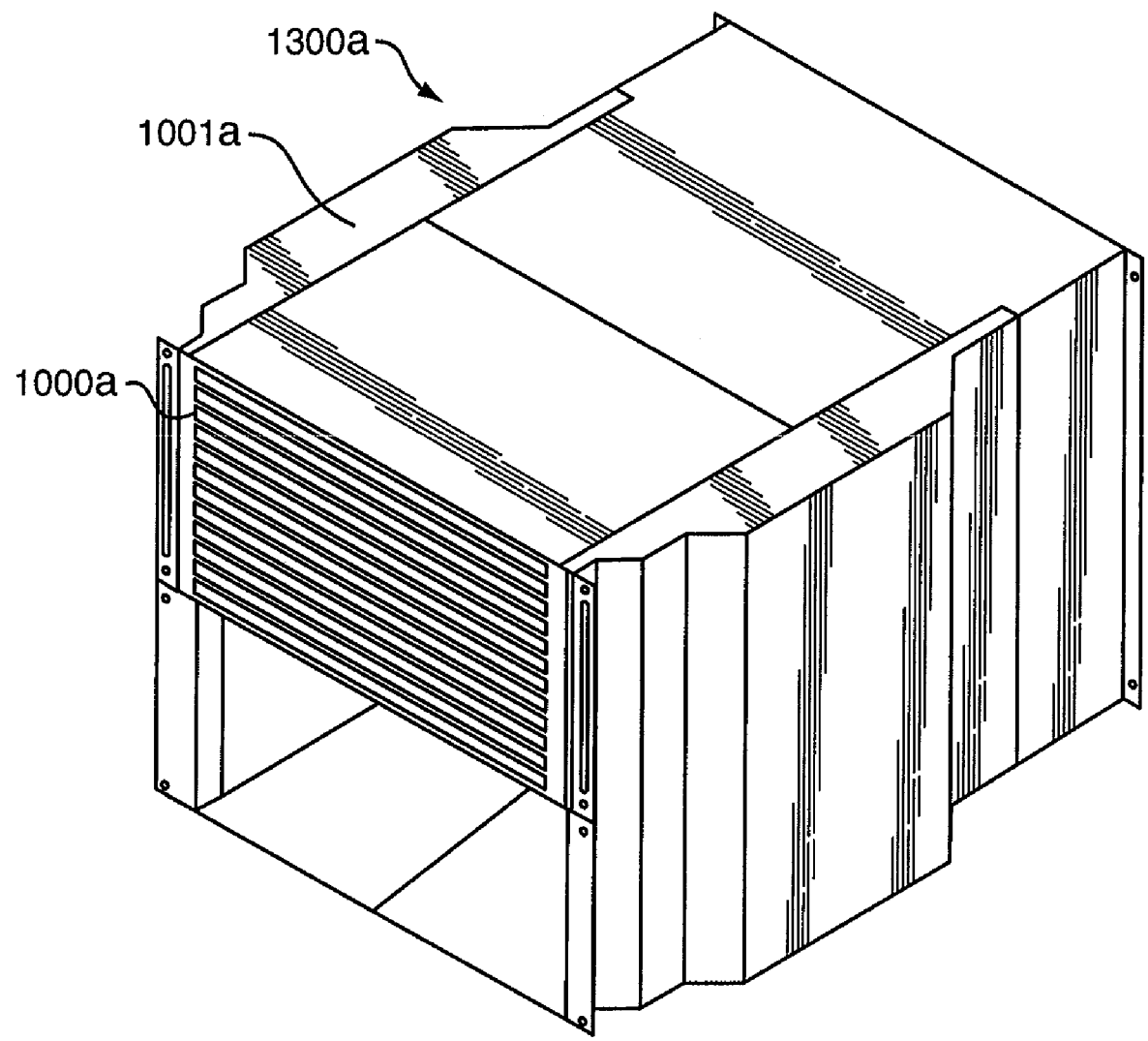
FIG. 18 is a perspective view of an alternate embodiment of the modular air management tray assembly of FIG. 8.

FIG. 18 illustrates an alternative embodiment 1300a of an air management tray assembly, which has the same functionality as air management tray 1300 but has a greater height to accommodate larger electronic devices, such as 9 U device 1000a.

Figure 19A:
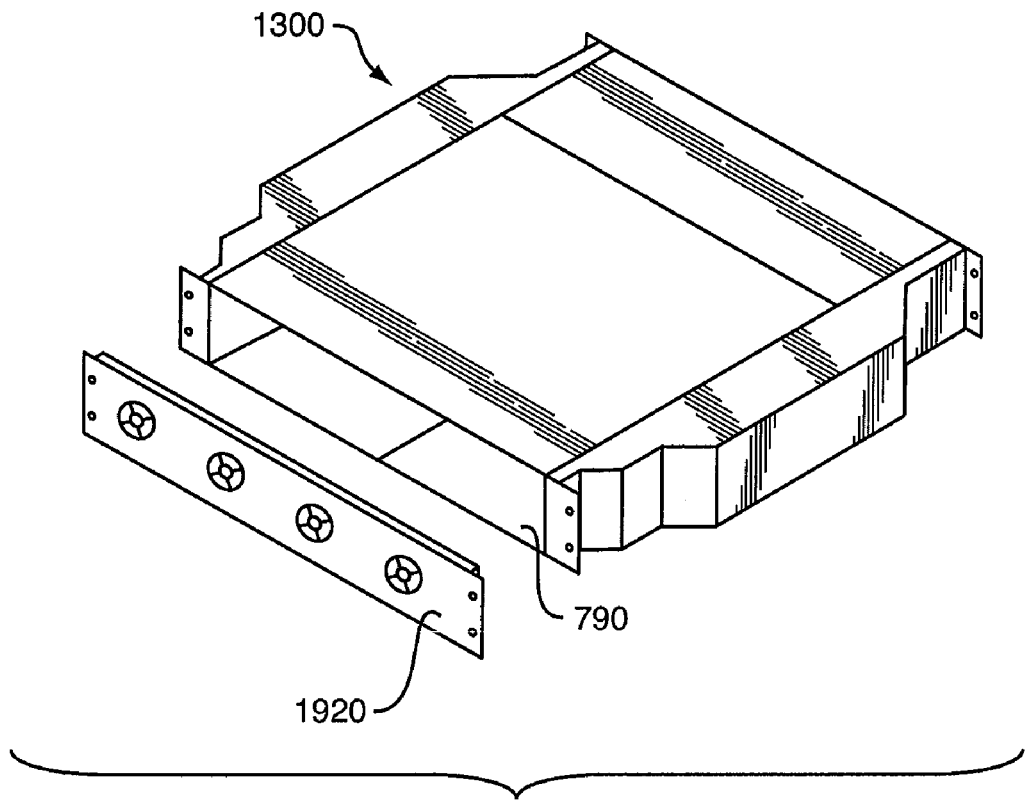
FIGS. 19A, 19B, 19C and 19D illustrate the addition of fan trays to the modular air management tray assembly of FIG. 8.
Figure 19B:
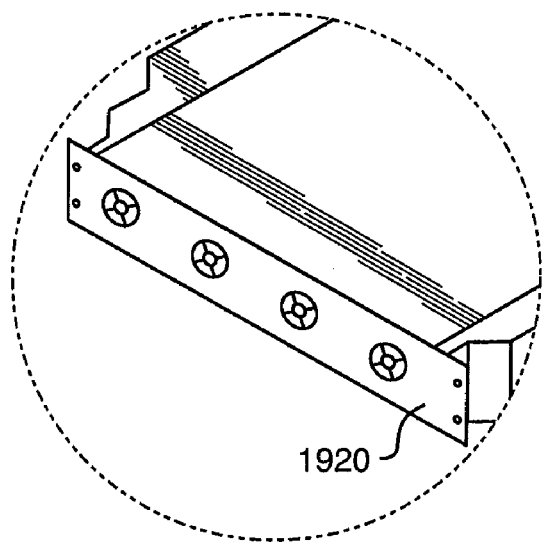
Figure 19C:
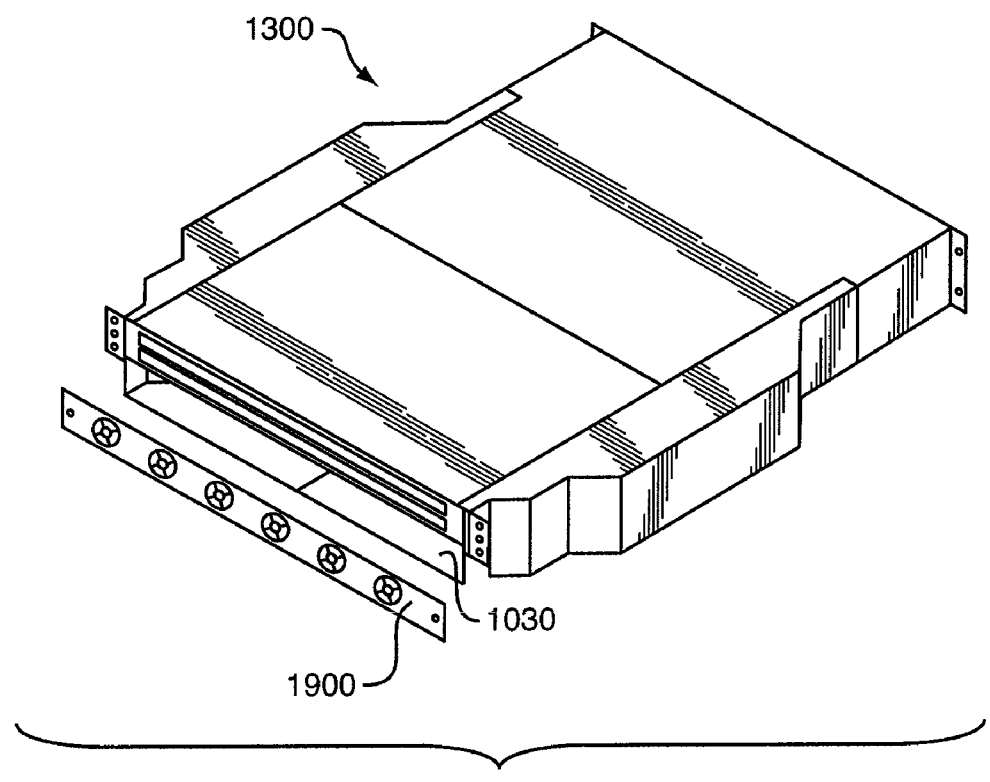
Figure 19D:
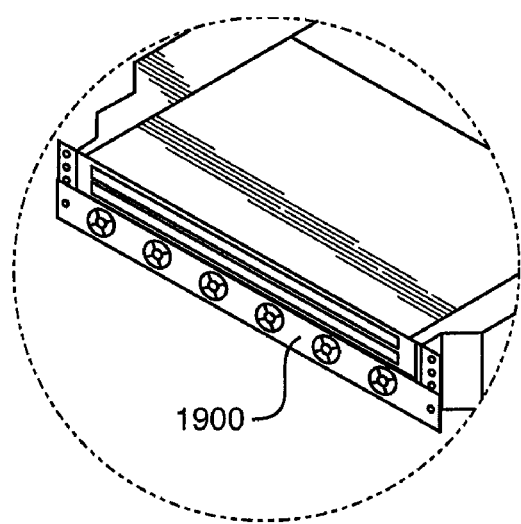

As shown in FIGS. 19A through 19D, fan trays may be added to provide additional air flow within the enclosure. FIGS. 19A and 19B show an air management tray assembly 1300 in which fan tray 1920 is placed in rear gap 790. Alternatively, or additionally, and as shown in FIGS. 19C and 19D, fan tray 1900 can be placed within air management tray assembly 1300 at front gap 1030.

Modular Vertical Mount Air Management Assembly

Figure 20A:
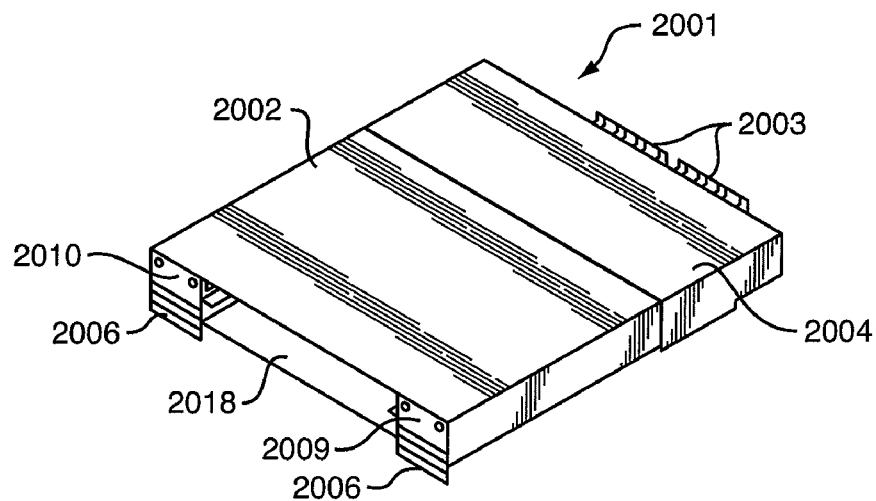
FIG. 20A is a perspective view of a modular vertical mount air management assembly according to an additional preferred embodiment of the invention.
Figure 20B:
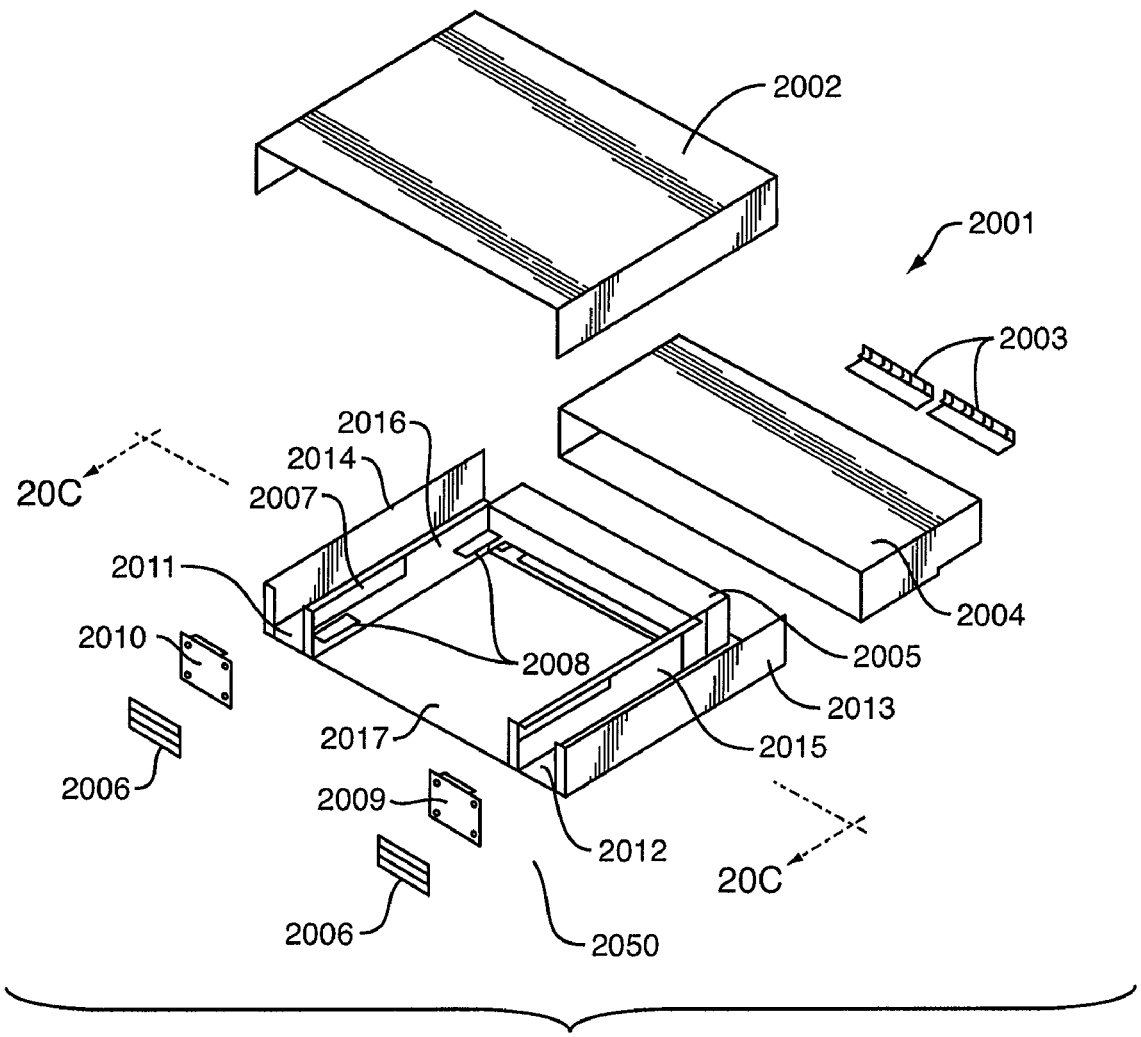
FIG. 20B is an exploded view of the modular vertical mount air management assembly of FIG. 20A.

In an additional preferred embodiment, and as shown in FIG. 20A, the invention comprises a vertical mount air management assembly 2001 for use with "side to side" breathing electronic devices and/or side inlet, rear exhaust electronic devices in a "front to back" air-distributed enclosure. As shown in FIGS. 20A and 20B, vertical mount air management assembly 2001 comprises cover 2002, tunnel 2004, front mounting brackets 2003, rear mounting brackets 2006, left and right blanking panels 2010 and 2009, respectively, open area 2018 and tray assembly 2050. In a preferred embodiment, vertical mount air management assembly 2001 is constructed of bent and formed sheet metal.

Figure 20C:
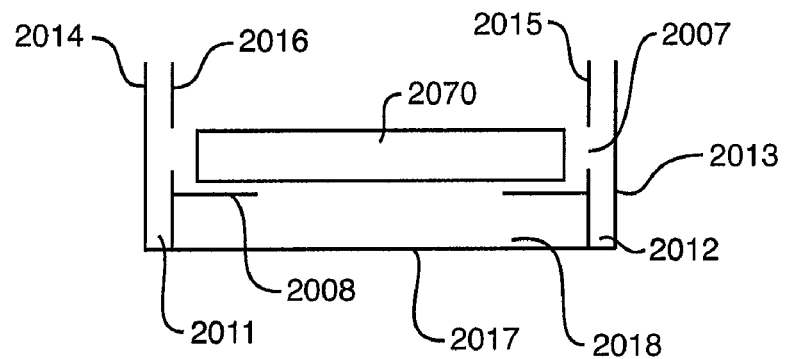
FIG. 20C is a cross-sectional view of the modular vertical mount air management assembly of FIG. 20B along line B-B.

With reference to FIGS. 20B and 20C, tray assembly 2050 is bilaterally symmetrical and comprises bottom surface 2017, rear wall 2005 inner panels 2015 and 2016, and outer panels 2013 and 2014. Outer panel 2014 and inner panel 2016 are substantially parallel and define a first air flow channel 2011. Similarly, outer panel 2013 and inner panel 2015 are substantially parallel and define a second air flow channel 2012. Inner panels 2015 and 2016 each comprise a pair of device supports 2008 and further define an open space 2007. As shown in FIGS. 20C, electronic device 2070 rests on device supports 2008, such that open area 2018 is beneath the electronic device 2070.

Figure 20D:
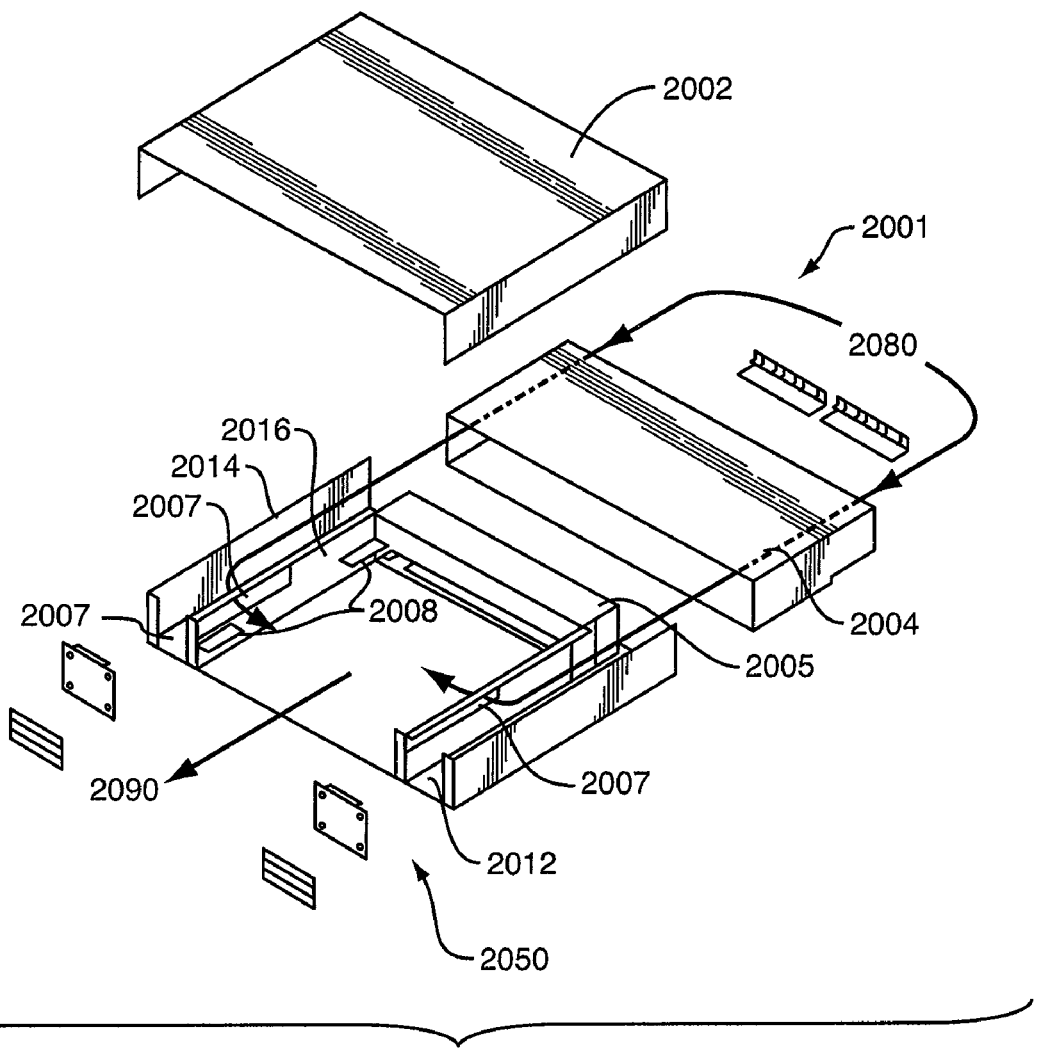
FIG. 20D illustrates the air flow pattern through the modular vertical mount air management assembly of FIG. 20B.

FIG. 20D illustrates the flow of air through vertical mount air management assembly 2001 when used with a side inlet, rear exhaust electronic device (not shown), in which cool air flow is indicated by reference arrows 2080 and warm air flow is referenced by arrow 2090. Cool air 2080 enters through the one end of air flow channels 2011 and 2012. Blanking panels 2009 and 2010 prevent the cool air from exiting through the opposite end of air flow channels 2011 and 2012. Cool air 2080 flows through open spaces 2007 and into the side inlets of the electronic device. Warm air 2090 exhausted at the rear of the electronic device is deflected by rear wall 2005 and passes under the electronic device and out of vertical mount air management assembly 2001 through open area 2018.

Figure 21A:
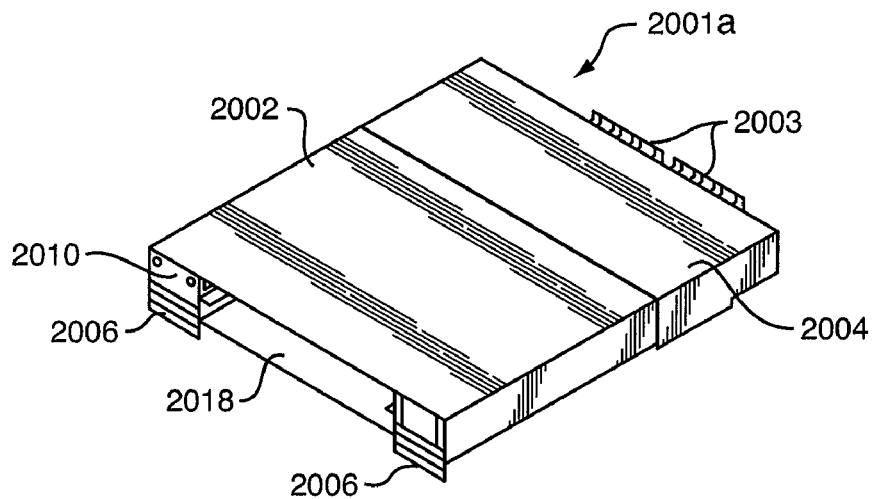
FIG. 21A is a perspective view of an alternate embodiment of the modular vertical mount air management assembly of FIG. 20A.
Figure 21B:
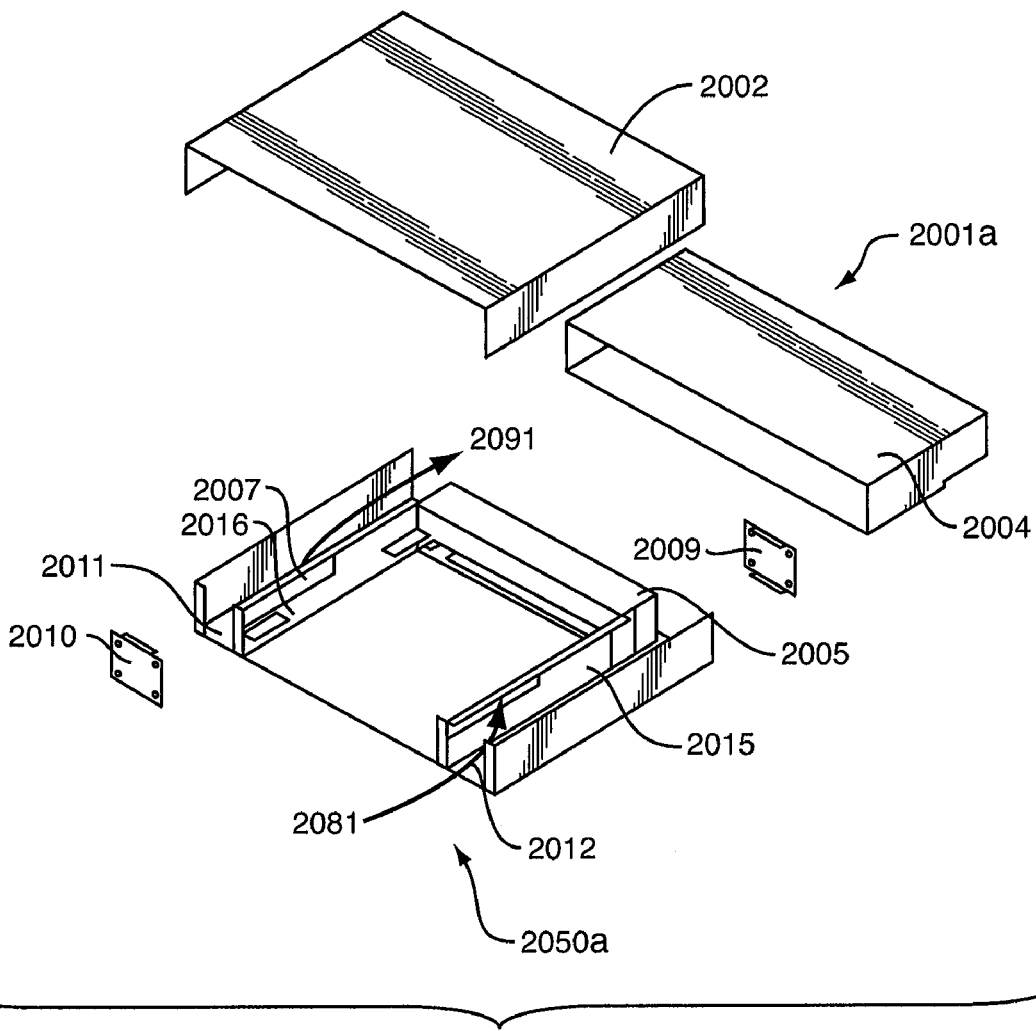
FIG. 21B is an exploded view of the modular vertical mount air management assembly of FIG. 21A, and further illustrates the air flow pattern through the modular vertical mount air management assembly of FIG. 21A.
Figure 22A:
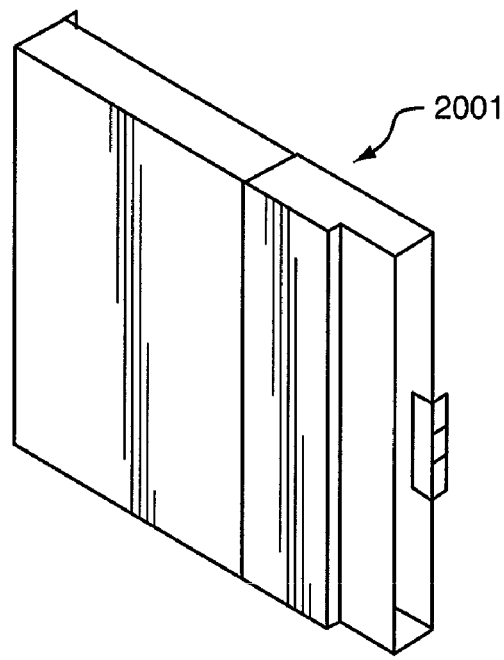
FIGS. 22A and 22B are perspective views of the modular vertical mount air management assembly of FIG. 20A, shown prior to mounting within an enclosure.
Figure 22C:
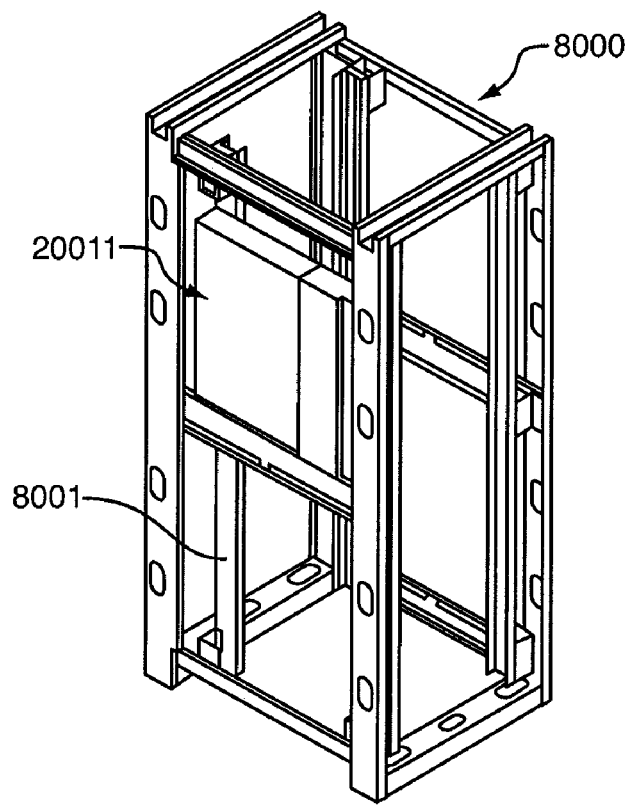
FIGS. 22C and 22D are perspective views of the modular vertical mount air management assemblies of FIGS. 22A and 22B, respectively, mounted within an enclosure.
Figure 22B:
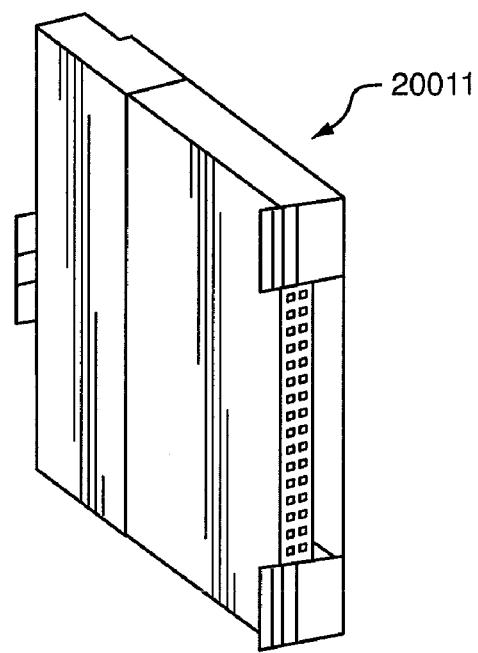
Figure 22D:
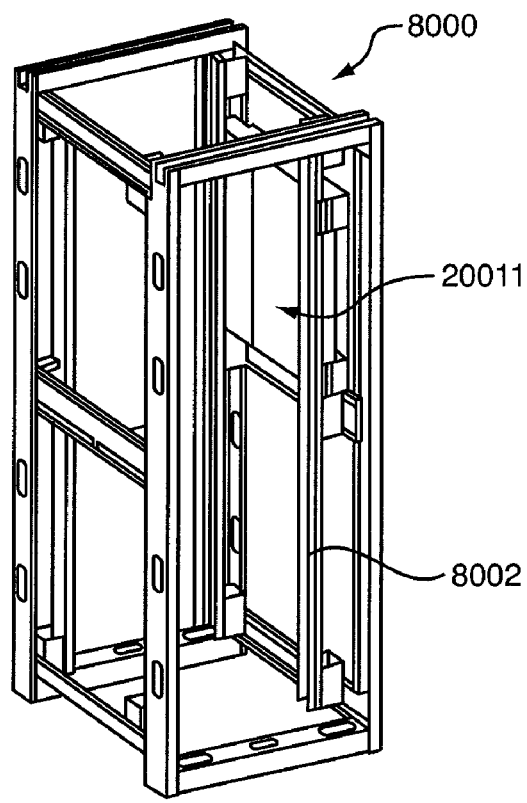

An alternative embodiment of the vertical mount air management assembly 2001a is shown in FIGS. 21A and B. With the exception of the location of blanking panel 2009, vertical mount air management assembly 2001a is identical to vertical mount air management assembly 2001. As shown in FIG. 21B, blanking panel 2009 has been moved to the rear of air flow channel 2012.

FIG. 21B illustrates the flow of air through vertical mount air management assembly 2001a when used with a "side to side" breathing electronic device (not shown), in which cool air flow is indicated by reference arrows 2081 and warm air flow is referenced by arrow 2091. Cool air 2081 enters through the one end of air flow channel 2012, and prevented from exiting the opposite end of channel 2012 by blanking panel 2009. Cool air enters into the side inlet of the electronic device through open space 2007 in inner panel 2015. Warm air 2091 exhausted at the opposite side of the electronic device flows into air flow channel 2011 through open area 2007 in inner panel 2016 and exits vertical mount air management assembly 2001 through the end opposite blanking panel 2010. Note that the invention is not limited by this particular embodiment, and blanking panel 2010 could alternatively, or additionally, be located at the opposite end of air channel 2011.

As shown in FIGS. 22A through D, enclosure 8000 comprises at least two interior rails 8001 and 8002, and vertical mount air management assembly 2001 is configured to mount outside rails 8001 and 8002

Modular Air Management Shroud Assembly

Figure 23A:
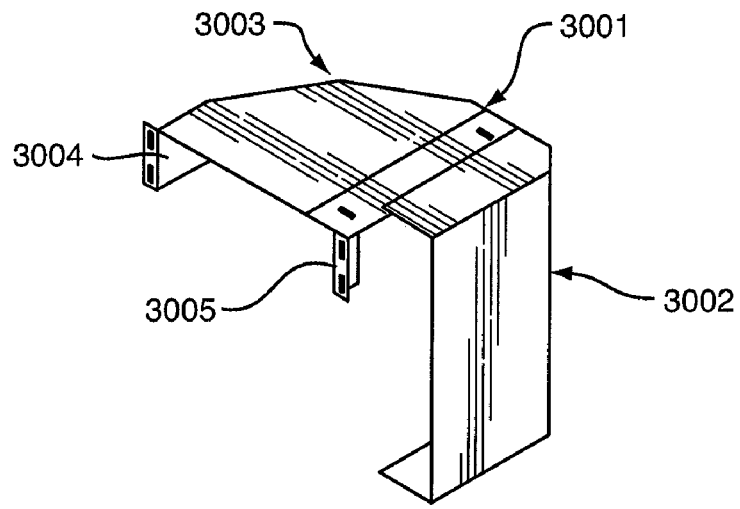
FIG. 23A is a perspective view of a modular air management shroud assembly according to an additional preferred embodiment of the invention.
Figure 23D:
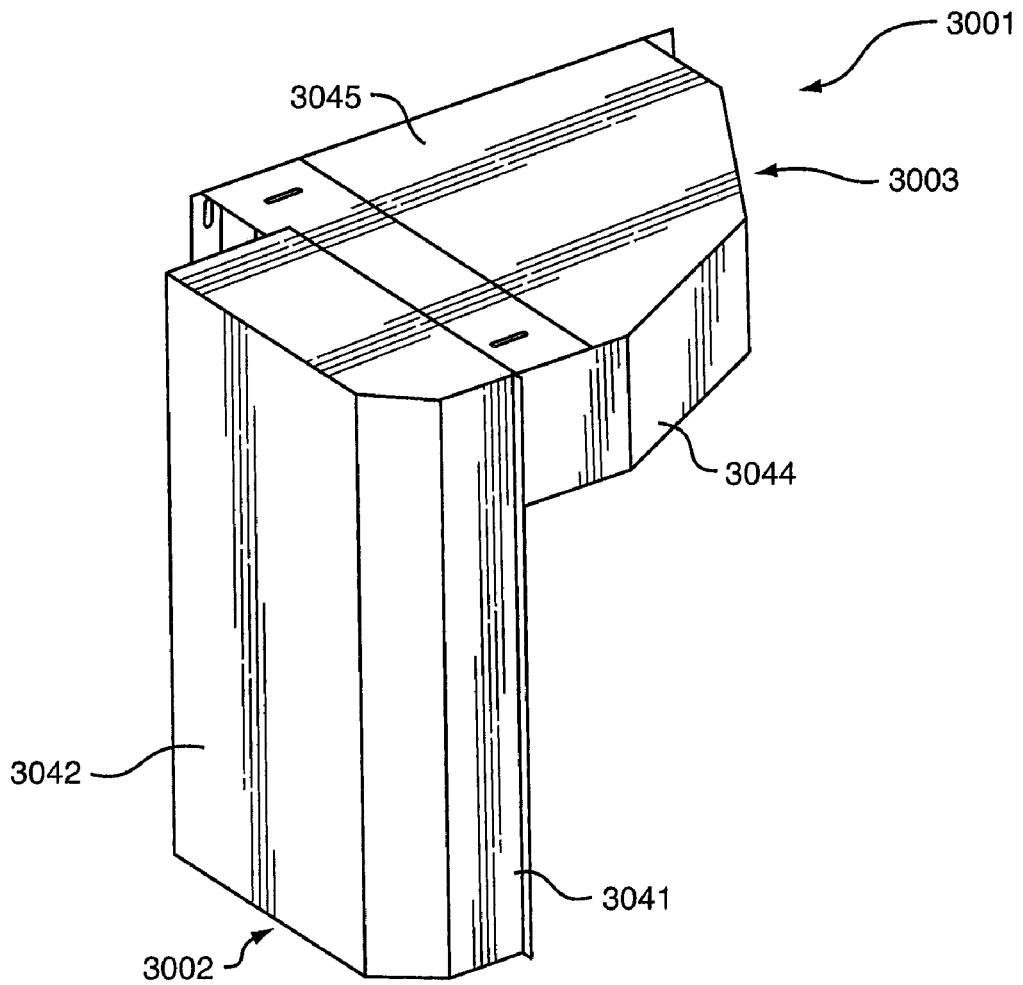
FIG. 23D is a perspective rear view of the modular air management shroud assembly of FIG. 23A.

In an additional preferred embodiment, and as shown in FIGS. 23A and 23D, the invention comprises a modular air management shroud assembly 3001 for use with side inlet electronic devices in a "front to back" air-distributed enclosure. Air management shroud assembly 3001 is generally "L"-shaped and comprises side panel 3002, top panel 3003 and mounting brackets 3004 and 3005. Side panel 3002 comprises side wall 3042 and rear wall 3041. In a preferred embodiment, and as shown in FIG. 23D, rear wall 3041 may be curved, to reduce air flow turbulence within the side panel 3002. In alternate embodiments, rear wall 3041 may be flat, and generally perpendicular to side wall 3042. Top panel 3003 comprises top wall 3045 and side wall 3044. In a preferred embodiment, and as shown in FIG. 23D, top wall 3045 and side wall 3044 are curved to reduce air flow turbulence. In alternate embodiments, top wall 3045 and side wall 3044 may be generally rectangular. In a preferred embodiment, air management shroud assembly 3001 is constructed of bent and formed sheet metal.

Figure 23B:
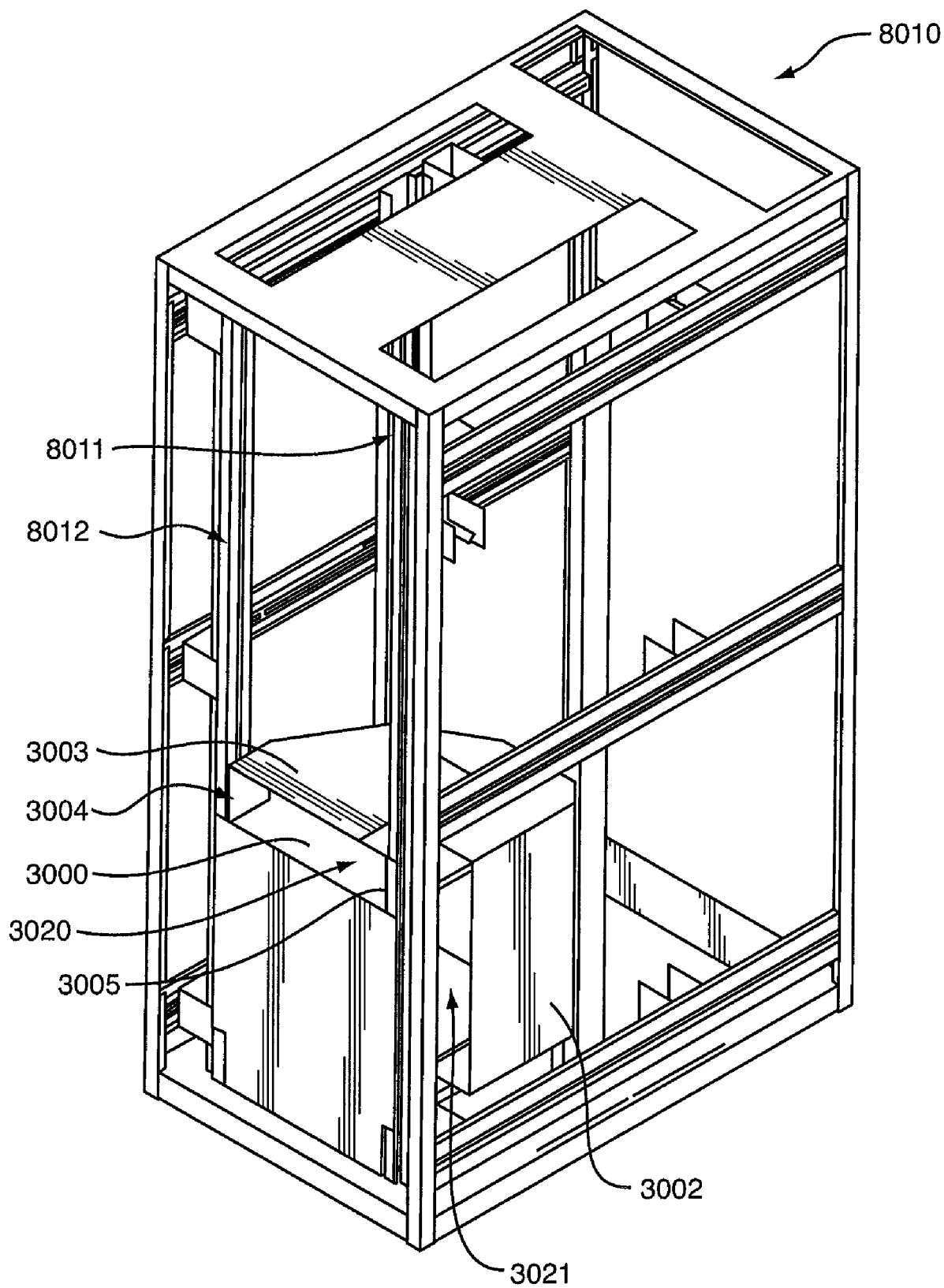
FIG. 23B is a perspective view of the modular air management shroud assembly of FIG. 23A mounted within an enclosure.

As shown in FIG. 23B, air management shroud assembly 3001 is coupled to the internal rails 8011 and 8012 of cabinet or enclosure 8010 by mounting brackets 3004 and 3005. Air management shroud assembly is installed above and to one side of electronic device 3000, and creates two air flow gaps 3020 and 3021. Top air flow gap 3020 is created above device 3000, and side air flow gap 3021 is created to the right of device 3000. Note that the invention is not limited to this particular configuration, and the air management shroud assembly may be constructed such that side panel 3002 is positioned to the left of electronic device 3000.

Figure 23C:
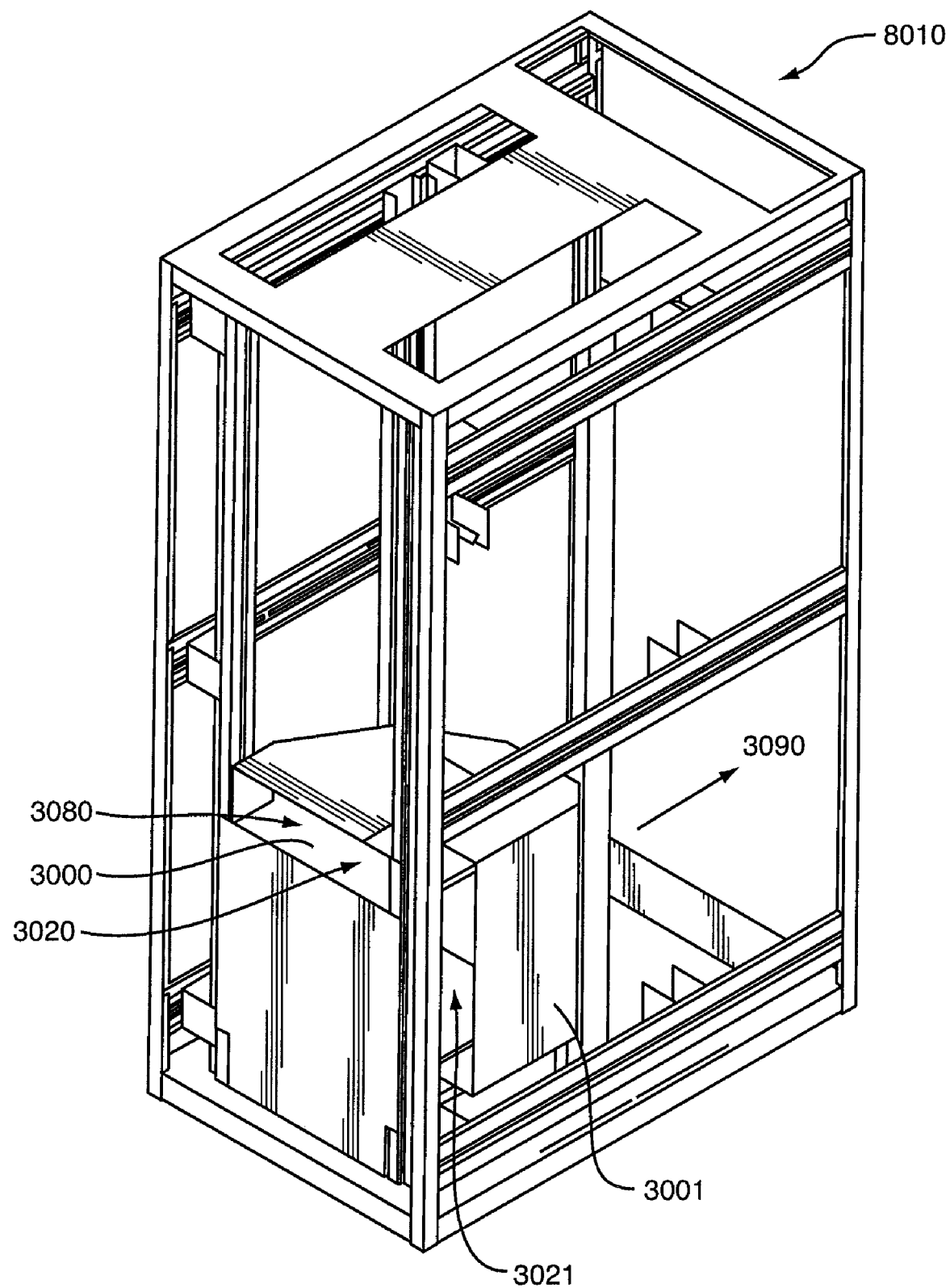
FIG. 23C illustrates the air flow pattern through the modular air management shroud assembly of FIG. 23A.

FIG. 23C illustrates air flow paths through cabinet or enclosure 8010, in which cool air flow is indicated by reference arrows 3080 and warm air flow is indicated by reference arrow 3090. Cool air 3080 enters air management shroud assembly 3001 at top air flow gap 3020 and side air flow gap 3021. Cool air 308 entering top air flow gap 3020 is directed downwards toward the rear of electronic device 3000 by side wall 3044. Cool air entering side air flow gap 3021 is directed inwards towards the right side of electronic device 3000 by rear wall 3041. Warm air 3090, heated by device 3000, is exhausted out of the rear of device 3000 below side wall 3044 into the rear of cabinet 8010.

The particular construction, materials and dimensions described herein are not limitations of the invention, as other constructions can accomplish the invention described herein.

Although specific features of the invention are shown in some figures and not others, this is for convenience only, as some features may be combined with any or all of the other features in accordance with the invention.

Recitation ranges of values herein are merely intended to serve as a shorthand method of referring individually to each separate value falling within the range, unless otherwise indicated herein, and each separate value is incorporated into the specification as if it were individually recited herein.

The use of any and all examples, or exemplary language (e.g., "such as") provided herein, is intended merely to better illustrate the invention and does not pose a limitation on the scope of the invention.

A variety of modifications to the embodiments described herein will be apparent to those skilled in the art from the disclosure provided herein. Thus, the invention may be embodied in other specific forms without departing from the spirit or essential attributes thereof.

What is claimed is:
1. An assembly for diverting air to or from an electronic device within an enclosure, the enclosure comprising a plurality of vertical structural members, the assembly comprising:
   a generally rectangular shelf comprising a shelf bottom, and left and right chambers at opposing sides of the shelf, each chamber comprising a top that is substantially parallel with the shelf bottom, and three substantially vertical side walls, such that each chamber is enclosed on three sides and has one open side, and where the open sides of the chambers face each other;

a tray comprising left and right shelves at opposing sides of the tray, a lower wall spaced below and between the two shelves, and a rear wall coupled to the lower wall and to the left and right shelves; and where the tray sits on the shelf such that the lower wall of the tray sits on the shelf bottom, and the left shelf is proximate the open side of the left chamber, and the right shelf is proximate the open side of the right chamber, forming left and right cavities below the first and second shelves; and where the left and right cavities are in fluid communication with an area behind the rear wall.

2. The assembly of claim 1, where the left and right shelves are adapted to support the electronic device and an air flow gap is formed between the shelf bottom and the bottom of the electronic device when the electronic device is placed on the left and right shelves.

3. The assembly of claim 1, where the shelf further comprises left and right mounting structures proximate the front of the shelf and at opposing sides of the shelf, and the tray further comprises left and right mounting structures proximate the front of the tray and at opposing sides of the tray, such that the tray left mounting structure is located coplanar with and just below the shelf left mounting structure and the tray right mounting structure is located coplanar with and just below the shelf right mounting structure when the tray sits on the shelf, and where the shelf mounting structures and the tray mounting structures are adapted to couple the assembly to at least two of the vertical structural members.

4. The assembly of claim 1, further comprising a tunnel structure comprising a top and a bottom, and a pair of opposing sidewalls, such that the tunnel structure is enclosed on two sides and is open at the front and rear, and where the tunnel structure is coupled to the shelf proximate the rear of the shelf.

5. The assembly of claim 4, where the top of the tunnel structure is adapted to slide over the top of the electronic device and the bottom of the tunnel structure is adapted to slide under the shelf bottom.

* * * * *